United States Patent
Glimcher et al.

(10) Patent No.: US 11,204,716 B2
(45) Date of Patent: Dec. 21, 2021

(54) COMPRESSION OFFLOADING TO RAID ARRAY STORAGE ENCLOSURE

(71) Applicant: EMC IP Holding Company LLC, Hopkinton, MA (US)

(72) Inventors: Boris Glimcher, Bnei Brak (IL); Amitai Alkalay, Kadima (IL); Zvi Schneider, Tel Aviv (IL)

(73) Assignee: EMC IP Holding Company LLC, Hopkinton, MA (US)

( * ) Notice: Subject to any disclaimer, the term of this patent is extended or adjusted under 35 U.S.C. 154(b) by 153 days.

(21) Appl. No.: 16/264,022

(22) Filed: Jan. 31, 2019

(65) Prior Publication Data
US 2020/0249869 A1 Aug. 6, 2020

(51) Int. Cl.
*G06F 12/00* (2006.01)
*G06F 12/08* (2016.01)
(Continued)

(52) U.S. Cl.
CPC .......... *G06F 3/0659* (2013.01); *G06F 3/061* (2013.01); *G06F 3/0608* (2013.01);
(Continued)

(58) Field of Classification Search
CPC ...... G06F 3/0659; G06F 3/0608; G06F 3/061; G06F 3/0689; G06F 12/0246; G06F 12/0882
(Continued)

(56) References Cited

U.S. PATENT DOCUMENTS

| 7,444,464 | B2 | 10/2008 | Urmston et al. | |
|---|---|---|---|---|
| 7,962,689 | B1 * | 6/2011 | Kazar | G06F 3/067 711/114 |

(Continued)

FOREIGN PATENT DOCUMENTS

WO     2016111954 A1     7/2016

OTHER PUBLICATIONS

EMC Corporation, "Introduction to the EMC XtremIO Storage Array (Ver. 4.0): A Detailed Review," White Paper, Apr. 2015, 65 pages.

(Continued)

*Primary Examiner* — Mohamed M Gebril
(74) *Attorney, Agent, or Firm* — Ryan, Mason & Lewis, LLP

(57) ABSTRACT

A storage system comprises a plurality of enclosures and a storage controller. Each enclosure comprises at least one processing device and a plurality of drives configured in accordance with a redundant array of independent disks (RAID) arrangement. The storage controller obtains data pages associated with an input-output request, provides the data pages to a processing device of a given enclosure, and issues a command to the processing device to perform at least one operation based at least in part on the data pages. The processing device of the given enclosure receives the data pages from the storage controller, generates compressed data pages based at least in part on the received data pages, stores one or more of the compressed data pages on the plurality of drives according to the RAID arrangement and returns information associated with the storage of the compressed data pages to the storage controller.

20 Claims, 8 Drawing Sheets

(51) Int. Cl.
  *G06F 13/00* (2006.01)
  *G06F 3/06* (2006.01)
  *G06F 12/0882* (2016.01)
  *G06F 11/10* (2006.01)
  *H03M 7/30* (2006.01)
  *G06F 12/02* (2006.01)

(52) U.S. Cl.
  CPC ........ *G06F 3/0689* (2013.01); *G06F 11/1076* (2013.01); *G06F 12/0246* (2013.01); *G06F 12/0882* (2013.01); *H03M 7/30* (2013.01); *G06F 2211/1014* (2013.01); *G06F 2212/401* (2013.01); *G06F 2212/7208* (2013.01)

(58) Field of Classification Search
  USPC .......................................................... 711/114
  See application file for complete search history.

(56) References Cited

U.S. PATENT DOCUMENTS

| | | | |
|---|---|---|---|
| 8,037,245 B2* | 10/2011 | Kitamura | G06F 11/1076 711/114 |
| 8,095,726 B1 | 1/2012 | O'Connell et al. | |
| 8,214,612 B1 | 7/2012 | Natanzon | |
| 9,037,793 B1 | 5/2015 | O'Brien, III et al. | |
| 9,104,326 B2 | 8/2015 | Frank et al. | |
| 9,208,162 B1 | 12/2015 | Hallak et al. | |
| 9,286,003 B1 | 3/2016 | Hallak et al. | |
| 9,552,258 B2 | 1/2017 | Hallak et al. | |
| 9,606,870 B1* | 3/2017 | Meiri | G06F 3/0661 |
| 9,716,754 B2 | 7/2017 | Swift | |
| 10,235,064 B1* | 3/2019 | Natanzon | G06F 3/0619 |
| 10,831,407 B2 | 11/2020 | Glimcher et al. | |
| 2003/0188097 A1* | 10/2003 | Holland | G06F 11/1076 711/114 |
| 2005/0257083 A1* | 11/2005 | Cousins | G06F 11/1092 714/6.2 |
| 2008/0049276 A1 | 2/2008 | Abe | |
| 2008/0183963 A1 | 7/2008 | He et al. | |
| 2008/0279462 A1 | 11/2008 | Celi, Jr. | |
| 2009/0106585 A1* | 4/2009 | Kitamura | G06F 11/1076 714/6.13 |
| 2009/0132955 A1 | 5/2009 | Garg et al. | |
| 2009/0198887 A1* | 8/2009 | Watanabe | G06F 11/1076 711/114 |
| 2010/0179941 A1 | 7/2010 | Agrawal et al. | |
| 2011/0239042 A1* | 9/2011 | S | G06F 11/1076 714/6.22 |
| 2012/0096237 A1* | 4/2012 | Punkunus | G06F 3/0659 711/209 |
| 2013/0325824 A1 | 12/2013 | Sheens | |
| 2014/0101514 A1* | 4/2014 | Cho | G06F 11/1076 714/758 |
| 2014/0181016 A1 | 6/2014 | Whitehead et al. | |
| 2014/0325262 A1* | 10/2014 | Cooper | G06F 11/108 714/6.22 |
| 2014/0359219 A1* | 12/2014 | Evans | G06F 12/0802 711/118 |
| 2015/0193342 A1* | 7/2015 | Ohara | G06F 12/0802 711/120 |
| 2015/0199151 A1* | 7/2015 | Klemm | G06F 3/0659 711/114 |
| 2015/0242134 A1* | 8/2015 | Takada | G06F 3/0619 711/114 |
| 2016/0150012 A1 | 5/2016 | Barszczak et al. | |
| 2016/0170987 A1 | 6/2016 | Kesselman | |
| 2016/0202927 A1 | 7/2016 | Klarakis et al. | |
| 2016/0224259 A1 | 8/2016 | Ahrens et al. | |
| 2016/0306574 A1 | 10/2016 | Friedman et al. | |
| 2016/0364181 A1 | 12/2016 | McGlaughlin et al. | |
| 2017/0010944 A1* | 1/2017 | Saito | G06F 3/064 |
| 2017/0153843 A1* | 6/2017 | Dewitt | G06F 3/0644 |
| 2017/0192857 A1 | 7/2017 | Meiri et al. | |
| 2018/0232277 A1 | 8/2018 | Nelogal et al. | |
| 2018/0341606 A1 | 11/2018 | Bolkhovitin et al. | |
| 2018/0357017 A1 | 12/2018 | Karr et al. | |
| 2019/0065306 A1 | 2/2019 | Margetts | |
| 2019/0121549 A1* | 4/2019 | Satoyama | G06F 3/0665 |
| 2019/0258570 A1* | 8/2019 | Hocken | G16H 20/40 |
| 2019/0347161 A1 | 11/2019 | Margetts | |
| 2020/0004631 A1* | 1/2020 | Jaquette | G06F 3/0619 |
| 2020/0004701 A1 | 1/2020 | Subbarao et al. | |
| 2020/0042390 A1* | 2/2020 | Roberts | G06F 11/1464 |
| 2020/0249869 A1* | 8/2020 | Glimcher | G06F 3/0608 |
| 2020/0319972 A1 | 10/2020 | Alkalay et al. | |

OTHER PUBLICATIONS

EMC Corporation, "Unstoppable Data Reduction: Always-on, In-Line, Zero-Penalty, Enterprise-Class, Free," https://store.emc.com/xtremio, Jul. 2014, 2 pages.

EMC Corporation, "Introduction to XtremIO Virtual Copies," White Paper, Mar. 2016, 39 pages.

EMC Corporation, "XtremIO Data Production (XDP): Flash-Specific Data Protection, Provided by XtremIO (Ver. 4.0)," White Paper, Apr. 2015, 25 pages.

Dell EMC, "XtremIO v6.0 Specifications," Specification Sheet, 2017, 4 pages.

Dell EMC, "Dell EMC XtremIO X2: Next-Generation All-Flash Array," Data Sheet, 2017, 5 pages.

EMC Corporation, "High Availability, Data Protection and Data Integrity in the XtremIO Architecture," White Paper, Apr. 2015, 28 pages.

Y. Zhang et al., "End-to-End Integrity for File Systems: A ZFS Case Study," Proceedings of the 8th USENIX Conference on File and Storage Technologies (FAST), Feb. 23-26, 2010, 14 pages.

Dell EMC, "Introduction to Dell EMC XtremIO X2 Storage Array—A Detailed Review," Dell EMC White Paper, Aug. 2017, 46 pages.

N. Tolia et al., "Opportunistic Use of Content Addressable Storage for Distributed File Systems," Proceedings of the USENIX Annual Technical Conference, Jun. 9-14, 2003, 14 pages.

EMC Corporation, "EMC Recoverpoint Replication of XtremIO: Understanding the Essentials of RecoverPoint Snap-Based Replication for XtremIO," EMC White Paper, Aug. 2015, 31 pages.

Dell EMC, "Introduction to Dell EMC XtremIO X2 Storage Array—A Detailed Review," Dell EMC White Paper, Apr. 2018, 52 pages.

Dell EMC, "Introduction to XtremIO Metadata-Aware Replication," Dell EMC White Paper, Apr. 2018, 18 pages.

\* cited by examiner

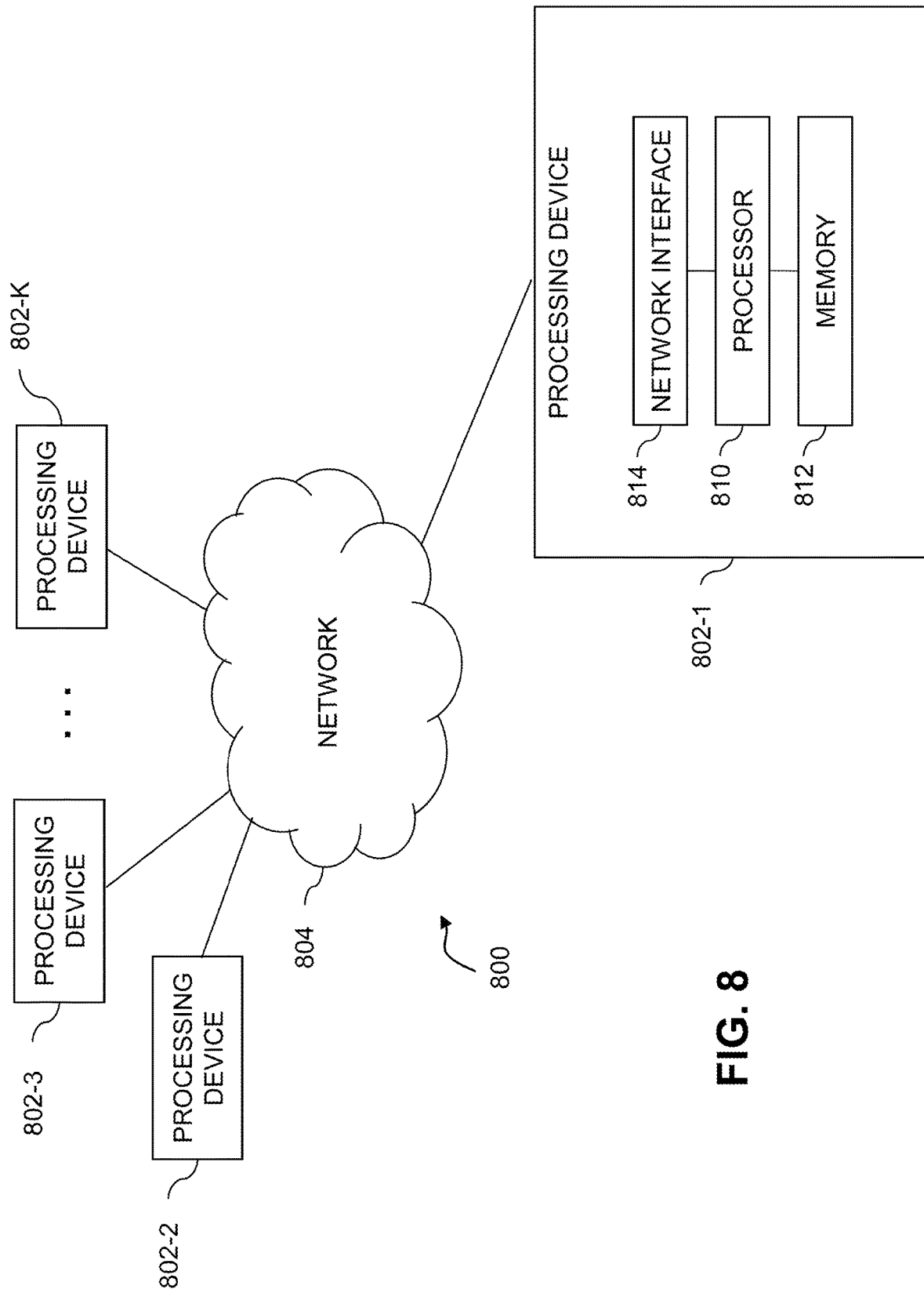

COMPRESSION OFFLOADING TO RAID ARRAY STORAGE ENCLOSURE

FIELD

The field relates generally to information processing systems, and more particularly to storage in information processing systems.

BACKGROUND

In many information processing systems, storage systems are key elements. Storage systems, such as block based storage systems, are designed to store and retrieve large amounts of data. To store a block of data, a host device typically provides a data block address and data block content to a storage system. The host device also provides the data block address to the storage system to retrieve the data block content stored in the storage system at a physical address. Some storage solutions rely on address-based mapping of data, as well as address-based functionality of a storage system's internal algorithms. For example, computing applications typically rely on address-based mapping and identification of data that is stored and retrieved. Another solution, in which data is mapped internally within a storage system and managed based on its content instead of its address, can provide various substantial advantages. For example, such a content-based storage solution improves storage capacity efficiency since any duplicate data blocks will only occupy the actual capacity of a single instance of that data block. As another example, the content-based storage solution can improve performance since duplicate block writes do not need to be executed internally in the storage system. Content-based storage solutions, however, face various challenges.

SUMMARY

In some embodiments, a storage system comprises a plurality of enclosures and a storage controller. Each enclosure comprises at least one processing device coupled to memory and a plurality of drives configured in accordance with a redundant array of independent disks (RAID) arrangement. The storage controller is configured to obtain data pages associated with at least one input-output request and to provide the obtained data pages to the at least one processing device of a given enclosure of the plurality of enclosures. The storage controller is further configured to issue a command to the at least one processing device of the given enclosure to perform at least one operation based at least in part on the obtained data pages. The at least one processing device of the given enclosure is configured to receive the obtained data pages from the storage controller and responsive to receiving the command from the storage controller, to generate compressed data pages based at least in part on the received data pages. The at least one processing device of the given enclosure is further configured to store one or more of the compressed data pages on the plurality of drives according to the RAID arrangement and to return information associated with the storage of the one or more of the compressed data pages to the storage controller. The storage controller is further configured to utilize the information to access the one or more of the compressed data pages stored on the plurality of drives.

These and other illustrative embodiments include, without limitation, apparatus, systems, methods and processor-readable storage media.

BRIEF DESCRIPTION OF THE DRAWINGS

FIGS. 7 and 8 show examples of processing platforms that may be utilized to implement at least a portion of an information processing system in illustrative embodiments.

DETAILED DESCRIPTION

Illustrative embodiments will be described herein with reference to exemplary information processing systems and associated computers, servers, storage devices and other processing devices. It is to be appreciated, however, that these and other embodiments are not restricted to the particular illustrative system and device configurations shown. Accordingly, the term "information processing system" as used herein is intended to be broadly construed, so as to encompass, for example, processing systems comprising cloud computing and storage systems, as well as other types of processing systems comprising various combinations of physical and virtual processing resources. An information processing system may therefore comprise, for example, at least one data center or other cloud-based system that includes one or more clouds hosting multiple tenants that share cloud resources. Numerous different types of enterprise computing and storage systems are also encompassed by the term "information processing system" as that term is broadly used herein.

Figure 1:
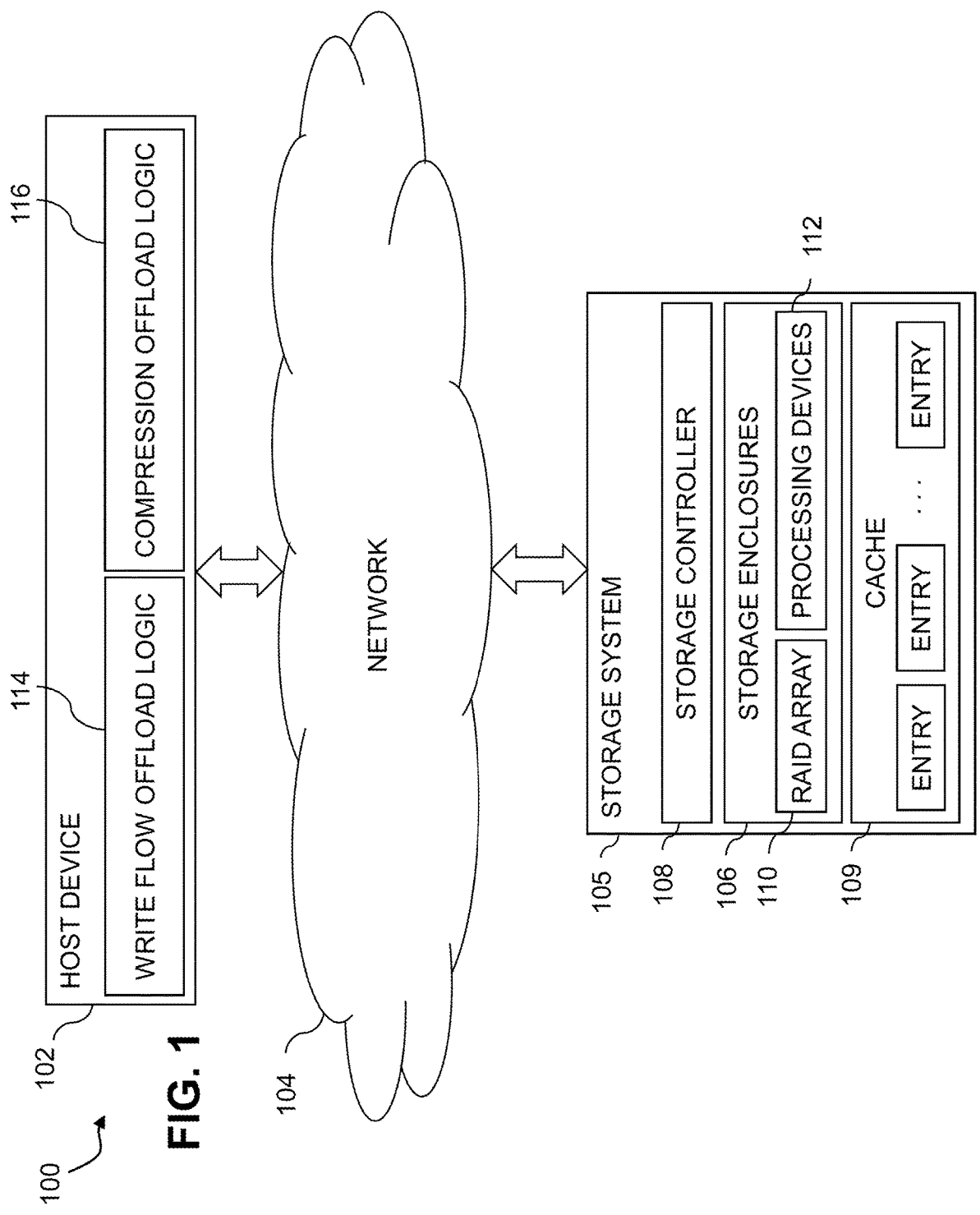
FIG. 1 is a block diagram of one example of an information processing system within which one or more illustrative embodiments are implemented.

FIG. 1 shows an information processing system 100 configured in accordance with an illustrative embodiment. The information processing system 100 comprises a host device 102, which may comprise one of a plurality of host devices of a computer system. The host device 102 communicates over a network 104 with a storage system 105. The host device 102 and storage system 105 may be part of an enterprise computing and storage system, a cloud-based system or another type of system.

The host device 102 and storage system 105 illustratively comprise respective processing devices of one or more processing platforms. For example, the host device 102 and the storage system 105 can each comprise one or more processing devices each having a processor and a memory, possibly implementing virtual machines and/or containers, although numerous other configurations are possible.

The host device 102 and the storage system 105 can additionally or alternatively be part of cloud infrastructure such as an Amazon Web Services (AWS) system. Other examples of cloud-based systems that can be used to provide one or more of host device 102 and storage system 105 include Google Cloud Platform (GCP) and Microsoft Azure.

The host device 102 is configured to write data to and read data from the storage system 105. The host device 102 and the storage system 105 may be implemented on a common processing platform, or on separate processing platforms. A wide variety of other types of host devices can be used in other embodiments.

The host device 102 in some embodiments illustratively provides compute services such as execution of one or more applications on behalf of each of one or more users associated with the host device 102.

The term "user" herein is intended to be broadly construed so as to encompass numerous arrangements of human, hardware, software or firmware entities, as well as combinations of such entities. Compute and/or storage services may be provided for users under a Platform-as-a-Service (PaaS) model, although it is to be appreciated that numerous other cloud infrastructure arrangements could be used. Also, illustrative embodiments can be implemented outside of the cloud infrastructure context, as in the case of a stand-alone computing and storage system implemented within a given enterprise.

The network 104 is assumed to comprise a portion of a global computer network such as the Internet, although other types of networks can be part of the network 104, including a wide area network (WAN), a local area network (LAN), a satellite network, a telephone or cable network, a cellular network, a wireless network such as a WiFi or WiMAX network, or various portions or combinations of these and other types of networks. The network 104 in some embodiments therefore comprises combinations of multiple different types of networks each comprising processing devices configured to communicate using Internet Protocol (IP) or other communication protocols.

As a more particular example, some embodiments may utilize one or more high-speed local networks in which associated processing devices communicate with one another utilizing Peripheral Component Interconnect express (PCIe) cards of those devices, and networking protocols such as InfiniBand, Gigabit Ethernet, Fibre Channel, or Non-Volatile Memory express Over Fabrics (NVMeOF). Numerous alternative networking arrangements are possible in a given embodiment, as will be appreciated by those skilled in the art.

The storage system 105 is accessible to the host device 102 over the network 104. The storage system 105 comprises a plurality of storage enclosures 106, an associated storage controller 108, and an associated cache 109.

The storage enclosures 106 illustratively comprises storage devices, such as, e.g., solid state drives (SSDs). Such SSDs are implemented using non-volatile memory (NVM) devices such as flash memory. Other types of NVM devices that can be used to implement at least a portion of the storage devices 106 include non-volatile random access memory (NVRAM), phase-change RAM (PC-RAM) and magnetic RAM (MRAM). These and various combinations of multiple different types of NVM devices may also be used.

However, it is to be appreciated that other types of storage devices can be used in other embodiments. For example, a given storage system as the term is broadly used herein can include a combination of different types of storage devices, as in the case of a multi-tier storage system comprising a flash-based fast tier and a disk-based capacity tier. In such an embodiment, each of the fast tier and the capacity tier of the multi-tier storage system comprises a plurality of storage devices with different types of storage devices being used in different ones of the storage tiers. For example, the fast tier may comprise flash drives while the capacity tier comprises hard disk drives. The particular storage devices used in a given storage tier may be varied in other embodiments, and multiple distinct storage device types may be used within a single storage tier. The term "storage device" as used herein is intended to be broadly construed, so as to encompass, for example, flash drives, solid state drives, hard disk drives, hybrid drives or other types of storage devices.

In some embodiments, the storage system 105 illustratively comprises a scale-out all-flash content addressable storage array such as an XtremIO™ storage array from Dell EMC of Hopkinton, Mass. Other types of storage arrays, including by way of example VNX® and Symmetrix VMAX® storage arrays also from Dell EMC, can be used to implement storage system 105 in other embodiments.

The term "storage system" as used herein is therefore intended to be broadly construed, and should not be viewed as being limited to content addressable storage systems or flash-based storage systems. A given storage system as the term is broadly used herein can comprise, for example, network-attached storage (NAS), storage area networks (SANs), direct-attached storage (DAS) and distributed DAS, as well as combinations of these and other storage types, including software-defined storage.

Other particular types of storage products that can be used to implement storage system 105 in illustrative embodiments include all-flash and hybrid flash storage arrays such as Unity™ software-defined storage products such as ScaleIO™ and ViPR®, cloud storage products such as Elastic Cloud Storage (ECS), object-based storage products such as Atmos®, and scale-out NAS clusters comprising Isilon® platform nodes and associated accelerators, all from Dell EMC. Combinations of multiple ones of these and other storage products can also be used in implementing a given storage system in an illustrative embodiment.

In the FIG. 1 embodiment, the storage enclosures 106 implement one or more RAID arrays of storage devices, denoted as RAID arrays 110. The RAID arrays 110 may collectively form a single RAID array 110, or may represent distinct RAID arrays. The RAID arrays 110 are assumed to store data in stripes across a plurality of SSDs or other storage devices provided by the storage enclosures 106. The RAID array 110 is an example of what is more generally referred to herein as data striping across a plurality of storage devices in a storage system.

In the FIG. 1 embodiment, the storage enclosures 106 also implement one or more processing devices 112. The processing devices 112 may comprise a microprocessor, a microcontroller, an application-specific integrated circuit (ASIC), a field-programmable gate array (FPGA), graphics processing unit (GPU) or other type of processing circuitry, as well as portions or combinations of such circuitry elements.

The cache 109 of storage system 105 in the FIG. 1 embodiment includes cache entries which store incoming input-output (IO) request data for later destaging to storage devices of the storage enclosures 106. Cache 109 may illustratively comprise volatile memory such as, e.g., random access memory (RAM), dynamic random-access memory (DRAM), static random-access memory (SRAM), or any other kind of volatile memory. In some embodiments, cache 109 may additionally or alternatively comprise any non-volatile memory as described above with respect to storage devices 106. In some embodiments, cache 109 may support a variety of operations or functions of storage system 105 including, for example, write cache, read cache, temporary metadata storage, or other similar operations. While illustrated as a separate component of storage system 105, in some embodiments, cache 109 may be included as a component of storage controller 108 or a component of each storage enclosure 106. In some embodiments, the caches 109 of storage system 105 may operate together as a single cache 109 where the components of a given storage system 105 may access any portion of the cache 109 including those portions included as components of other portions of storage system 105.

In an illustrative embodiment, as illustrated in FIG. 1, the host device 102 includes write flow offload logic 114 which provides logic and functionality for offloading some or all of the RAID processing of data pages for write requests from the storage controller 108 to the processing devices 112 of the storage enclosures 106. By offloading RAID processing, the availability of the storage controller 108 for servicing additional input-output operations is increased. The write flow offload logic 114 will be described in more detail below.

In another illustrative embodiment, as also illustrated in FIG. 1, the host device 102 includes compression offload logic 116 which provides logic and functionality for offloading some or all of the compression processing of data pages from the storage controller 108 to the processing devices 112 of the storage enclosures 106. By offloading compression processing, the availability of storage controller 108 for servicing additional input-output operations is increased. The compression offload logic 116 will be described in more detail below.

While described as separate embodiments, in an illustrative embodiment, the write flow offload logic 114 and compression offload logic 116 may alternatively be implemented together by the host device 102.

The host device 102 should also be understood to include additional modules and other components typically found in conventional implementations of computers, servers or other host devices, although such additional modules and other components are omitted from the figure for clarity and simplicity of illustration.

The host device 102 and storage system 105 in the FIG. 1 embodiments are assumed to be implemented using at least one processing platform each comprising one or more processing devices each having a processor coupled to a memory. Such processing devices can illustratively include particular arrangements of compute, storage and network resources.

The host device 102 and the storage system 105 may be implemented on respective distinct processing platforms, although numerous other arrangements are possible. For example, in some embodiments at least portions of the host device 102 and at least portions of the storage system 105 are implemented on the same processing platform. The storage system 105 can therefore be implemented at least in part within at least one processing platform that implements at least a portion of the host device 102.

The term "processing platform" as used herein is intended to be broadly construed so as to encompass, by way of illustration and without limitation, multiple sets of processing devices and associated storage systems that are configured to communicate over one or more networks. For example, distributed implementations of the system 100 are possible, in which certain components of the system reside in one data center in a first geographic location while other components of the system reside in one or more other data centers in one or more other geographic locations that are potentially remote from the first geographic location. Thus, it is possible in some implementations of the system 100 for the host device 102 and storage system 105 to reside in different data centers. Numerous other distributed implementations of one or both of the host device 102 and the storage system 105 are possible. Accordingly, the storage system 105 can also be implemented in a distributed manner across multiple data centers.

Additional examples of processing platforms utilized to implement host devices and/or storage systems in illustrative embodiments will be described in more detail below in conjunction with FIGS. 6-8.

It is to be appreciated that these and other features of illustrative embodiments are presented by way of example only, and should not be construed as limiting in any way.

Accordingly, different numbers, types and arrangements of system components such as host device 102, network 104, storage system 105, storage enclosures 106, storage controllers 108, cache 109, RAID arrays 110 and processing devices 112 can be used in other embodiments.

It should be understood that the particular sets of modules and other components implemented in the system 100 as illustrated in FIG. 1 are presented by way of example only. In other embodiments, only subsets of these components, or additional or alternative sets of components, may be used, and such components may exhibit alternative functionality and configurations. Additional examples of systems implementing functionality for write flow and compression offloading using the processing devices of the storage enclosures will be described below.

Figure 2:
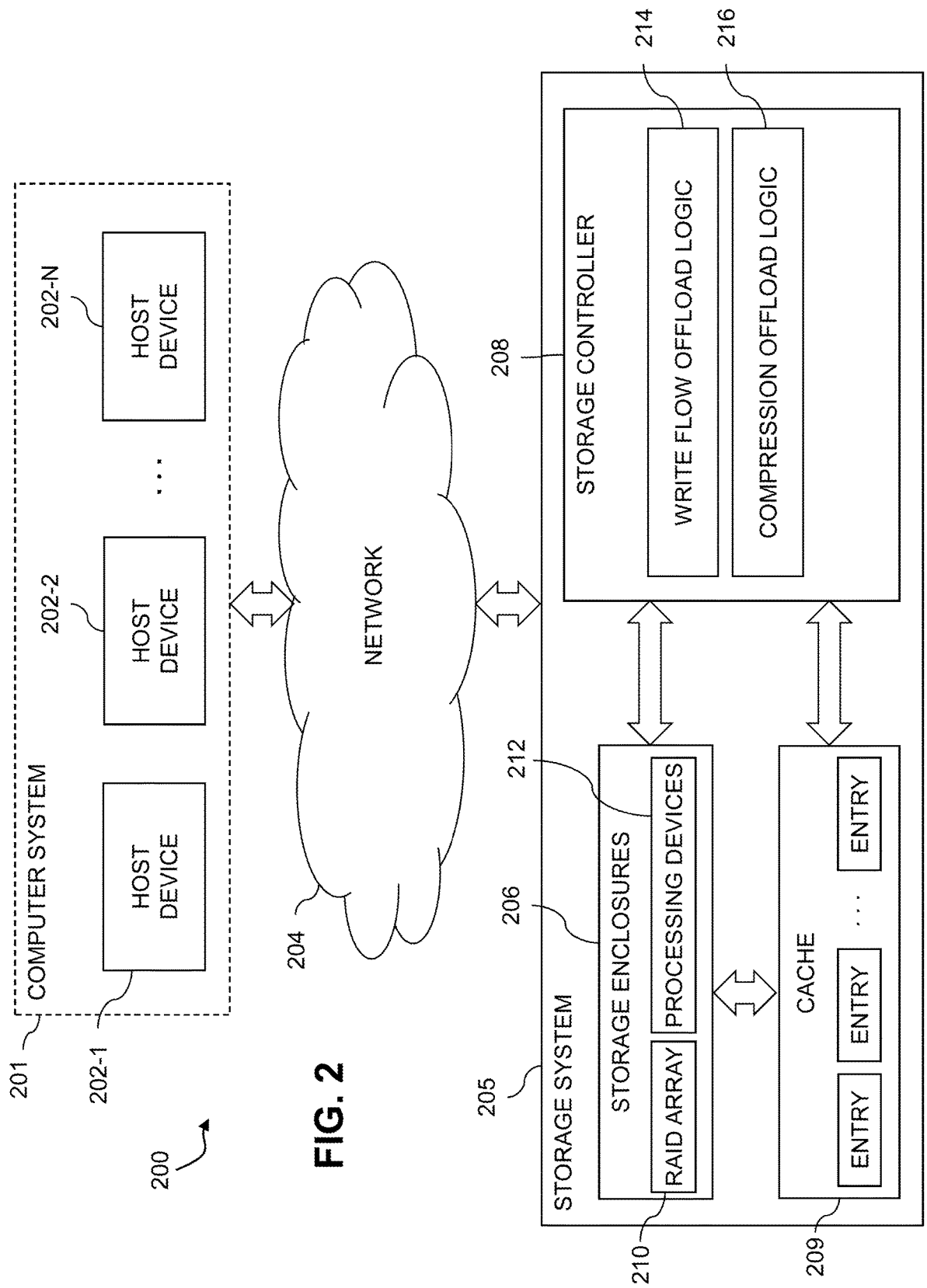
FIG. 2 is a block diagram of another example of an information processing system within which one or more illustrative embodiments are implemented.

FIG. 2 shows an information processing system 200 configured in accordance with other illustrative embodiments. The information processing system 200 comprises a computer system 201 that includes host devices 202-1, 202-2, . . . 202-N collectively referred to as host devices 202. The host devices 202 communicate over a network 204 with a storage system 205. The computer system 201 is assumed to comprise an enterprise computer system, cloud-based computer system or other arrangement of multiple compute nodes associated with respective users. The host devices 202 of the computer system 201 in some embodiments illustratively provide compute services such as execution of one or more applications on behalf of each of one or more users associated with respective ones of the host devices 202.

Similar to the storage system 105 of system 100, the storage system 205 comprises storage enclosures 206, a storage controller 208, a cache 209, a RAID array 210, and processing devices 212. However, in these embodiments, the functionality for write flow offloading and compression offloading is implemented in the storage system 205, rather than in one of the host devices 202. Accordingly, the storage controller 208 in these embodiments comprises one or both of write flow offload logic 214 and compression offload logic 216, which are configured to operate in substantially the same manner as that described above for write flow offload logic 114 and compression offload logic 116 of the host device 102 in the system 100. In some embodiments, functionality for write flow and compression offloading can be implemented partially in a host device and partially in the storage system. Accordingly, illustrative embodiments are not limited to arrangements in which all such functionality is implemented in a host device or a storage system, and therefore encompass various hybrid arrangements in which the functionality is distributed over one or more host devices and one or more storage systems, each comprising one or more processing devices.

In some embodiments, the processing devices 212 of the storage enclosures 206 may implement some or all of the functionality of write flow offload logic 214, compression offload logic 216, or both. In some embodiments, the functionality of write flow offload logic 214 and compression offload logic 216 may be implemented in part by the processing devices 212 and in part by the storage controller 208, host devices 202 or both.

Illustrative write flow and compression offloading operations will now be described in further detail in the context of the information processing systems 100 and 200. However, it is to be understood that write flow and compression offloading are more generally applicable to other types of information processing systems. At least some of the write flow and compression offloading steps are illustratively performed under the control of the write flow offload logic 114 and compression offload logic 116 in host device 102 of system 100, in write flow offload logic 212 and compression offload logic 214 in storage controller 208, processing devices 212, or both, of system 200.

Data striping in some embodiments is implemented utilizing RAID, using RAID arrays 110 on storage system 105 or RAID arrays 210 on storage system 205. In such embodiments, the number of data disks in the RAID storage system may comprise a prime number k, and a column of the RAID storage system comprises k–1 blocks. The storage devices of the RAID storage system may be SSDs. In some embodiments, the RAID storage system may implement RAID 6 with the number of data disks being k and the number of parity disks being n, where n is greater than one (e.g., where n=2). In some embodiments, the stripe column size is selected as a multiple of a designated block size. The multiple may be a prime number P minus 1. The prime number P may be the same as or different than the prime numbers selected for different ones of the stripes.

In some cases, the prime number selected for a particular stripe may be greater than a number of the plurality of storage devices in the storage system that store data blocks for that stripe. To handle such situations, the parity blocks for the stripe may be computed by assuming or setting a set of virtual storage devices with pages storing designated predetermined values (e.g., zero pages). The particular number of virtual storage devices in the set may be equal to the difference between the prime number selected for that stripe and the number of storage devices in the storage system which store data blocks for that stripe.

The term RAID, as used herein, is an umbrella term for computer data storage schemes that can divide and replicate data among multiple physical disk drives. The terms disks and drives will be used interchangeably henceforth. The physical disks are said to be in a RAID array, which is accessed by an operating system as one single disk. The different schemes or architectures are named by the word RAID followed by a number (e.g., RAID 0, RAID 1, etc.). Each scheme provides a different balance between the goals of increasing data reliability and increasing input/output performance. While in some embodiments, the storage system is described herein with reference to a RAID array having a RAID 6 scheme, any other RAID scheme may be used in the disclosed embodiments.

The RAID 6 scheme was developed to provide functionality for recovering from multiple disk failure (e.g., similar to RAID 1.3) with high utilization rates (e.g., comparable to RAID 4 and 5) that avoids system bottlenecks. RAID 6 uses an N+2 parity scheme, which allows failure of two disks, where N is the number of disks in the array. RAID 6 defines block-level striping with double distributed parity and provides fault tolerance of two drive failures, so that the array continues to operate with up to two failed drives, irrespective of which two drives fail.

There are various implementations of RAID 6, which may use varying coding schemes. As the term is used herein, RAID 6 is defined as any N+2 coding scheme which tolerates double disk failure, while user data is kept in the clear. This additional requirement assures that user reads are not affected by the RAID scheme under normal system operation. Examples of RAID 6 schemes include those that utilize the Reed Solomon error correction code and those that utilize parity bits, such as those wherein N data disks are supported by two redundancy disks each holding a different parity bit. It should be noted that if all parity bits are on the same two disks, then the performance may be subject to bottlenecks. This can be solved by use of distributed parity stripes over N+2 disks similar to that specified in RAID 5. Examples of coding schemes based on parity calculations of rows and diagonals in a matrix of blocks include Even/Odd and Row Diagonal Parity (RDP). Both of these schemes utilize a first parity disk "P" that holds the parities of rows of blocks as well as a second parity disk "Q" that contains blocks that hold the parity of diagonals of data blocks. In both schemes, it is advantageous to work with a block size that is smaller than the native page size. For example, the native page size may be 8 kilobytes (KB), while the block size is smaller but evenly divisible into 8 KB, e.g., 0.5 KB, 1 KB, 2 KB, 4 KB. In an example where the native page size is 8 KB and the block size is 2 KB, each stripe thus may contain four rows, and thus the four blocks present on each disk form a single native page. However, a stripe can also be defined by multiple rows of blocks distributed across the storage devices of the RAID array. It is assumed that pages are read and written using a single disk operation.

An example RAID array includes five data disks denoted D0 through D4. A storage controller (e.g., such as storage controller 108 or storage controller 208) is configured for writing initial data into the RAID array, and for updating existing data in the RAID array. The storage controller further provides functionality for recovering data after single or double disk failure.

Each of the disks in the RAID array stores a column of data blocks. The same data block in successive disks forms a row, which is to say the rows cross the disks. The data storage blocks are stored alongside parity data blocks in parity disks denoted P and Q, and the numbers of data blocks in the different columns or disks may be different. Row parity blocks are placed in a row parity column in disk P, and the diagonal parity data is placed in diagonal parity blocks in disk Q.

In the case of five data columns and four data rows, the number of diagonals is one greater than the number of rows. Thus, the diagonal parity column in disk Q includes one more block than the other columns for disks D0 through D4 and the row parity disk P.

The number of data columns is a prime number, and the number of rows is one less than that prime number (e.g., in the example the prime number is 5, which corresponds to the five data disks D0 through D4). It should be noted that, in practice, the various columns are distributed over the available physical disks to avoid system bottlenecks.

In one example distribution of data blocks in the RAID array, there are k data disks, where k=5 is a prime number, and there are five data columns corresponding to disks D0 through D4. There are four rows (e.g., k–1). The P column includes the same four rows as the data columns D0 through D4, but the Q column has an extra row. In one example, each stripe is considered to contain k (where k must be prime) data columns D0 through D4, and two parity columns P and Q. The stripe is composed of a quasi-matrix of blocks, which contain k−1 rows. Column P contains k−1 blocks, each providing the parity of the k data disk blocks in its row. The k by k−1 matrix made up of the blocks in the data columns includes k diagonals each of size k−1. Column Q, in contrast with the rest of the columns, contains k blocks and not k−1. Each of the k blocks in disk Q holds the parity of one of the diagonals. It should be noted that the ordering of blocks within each column may be arbitrary. Furthermore, the extra block in column Q may be placed in a data column which does not contain a data block in the diagonal of which this block is the parity. Also, some of the rows may be blank.

It should be appreciated that there are various other ways to distribute data blocks in an array such as the example RAID array. For example, in some cases it may be desired to provide more than one row parity column, which results in higher capacity overhead but which allows for a faster rebuild after a single disk failure.

Additional details regarding the above-described techniques for storing data in RAID arrays are disclosed in U.S. Pat. No. 9,552,258, entitled "Method and System for Storing Data in RAID Memory Devices," which is incorporated by reference herein.

Figure 3:
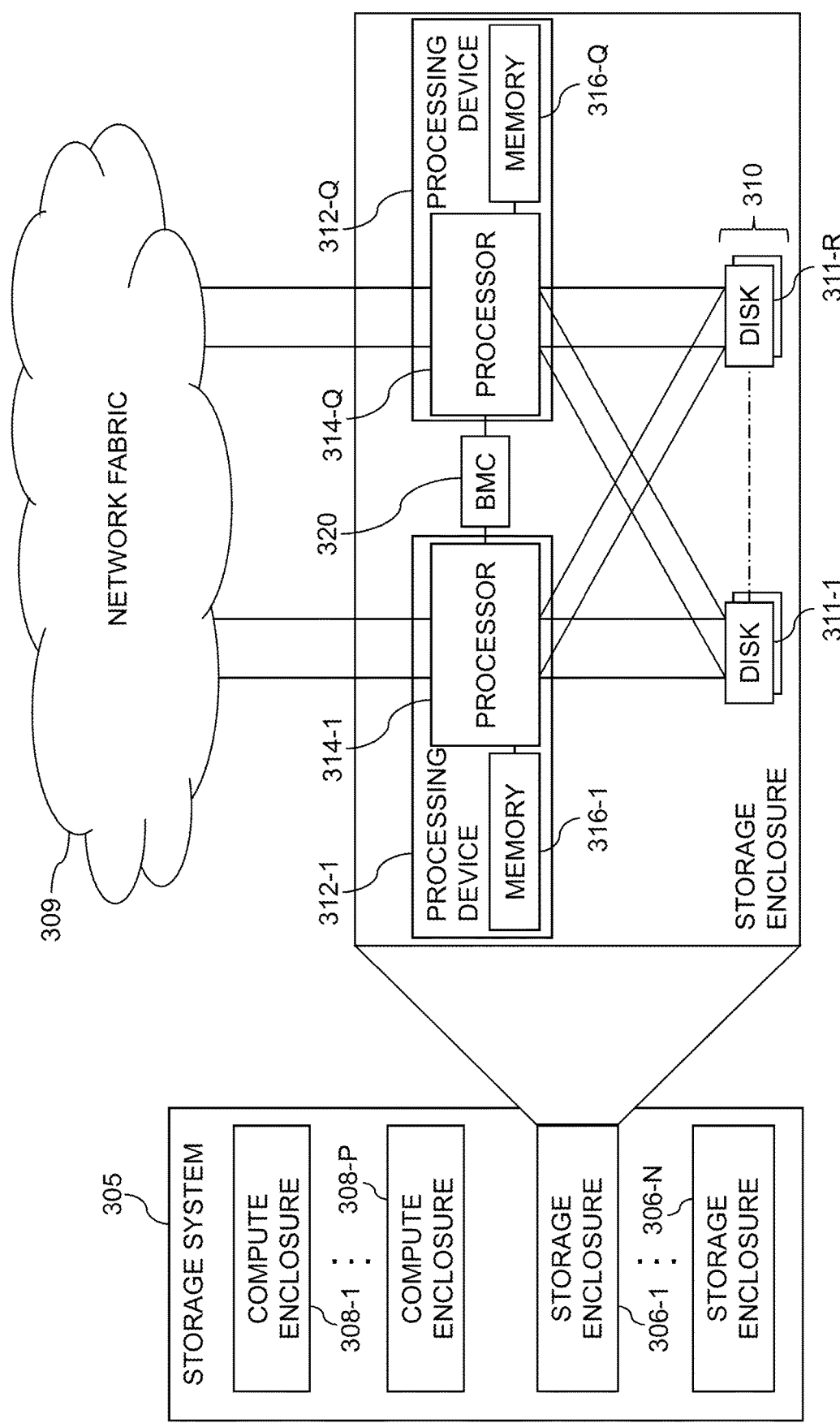
FIG. 3 is a block diagram of one example of a storage system within which one or more illustrative embodiments are implemented.

In an illustrative embodiment, with reference now to FIG. 3, an example storage system 305 is illustrated that implements NVMeOF protocols. In some embodiments, storage system 105 of FIG. 1 or storage system 205 of FIG. 2 may comprise storage system 305 as illustrated in FIG. 3.

Storage system 305 comprises a plurality of storage enclosures 306, e.g., storage enclosures 306-1 through 306-N, one or more compute enclosures 308, e.g., compute enclosures 308-1 through 308-P, and a network fabric 309. In some embodiments, each storage enclosure 306 and compute enclosure 308 may be physically located on a respective shelf of the storage system 305 and may communicate via the network fabric 309 according to NVMeOF protocols.

Storage enclosures 306 comprise a RAID array 310, e.g., an array of disks 311-1 through 311-R, similar to RAID arrays 110 and 210. Disks 311-1 through 311-R may comprise any storage device including, for example, SSDs, platter drives, or any other storage device, similar to the storage devices of RAID arrays 110 and 210. While described as a separate RAID array 310 for each storage enclosure 306, in some embodiments the respective RAID arrays 310 of some or all of the storage enclosures 306 may function as a single RAID array 310.

Storage enclosures 306 also comprise one or more processing devices 312, e.g., processing devices 312-1 through 312-Q, similar to processing devices 112 of FIG. 1 and 212 of FIG. 2, as described above. In some embodiments, each processing device 312 comprises one or more processors 314 coupled to a memory 316. For example, processing device 312-1 comprises a processor 314-1 coupled to a memory 316-1, processing device 312-Q comprises a processor 314-Q coupled to a memory 316-Q, etc.

Processors 314 comprise any processor including, for example, a microprocessor, a microcontroller, an application-specific integrated circuit (ASIC), a field-programmable gate array (FPGA), graphics processing unit (GPU) or other type of processing circuitry, as well as portions or combinations of such circuitry elements.

Memory 316 may comprise random access memory (RAM), read-only memory (ROM), flash memory or other types of memory, in any combination. The memory and other memories disclosed herein should be viewed as illustrative examples of what are more generally referred to as "processor-readable storage media" storing executable program code of one or more software programs.

Each processing device 312 of a given storage enclosure 306 is configured to communicate with the RAID array 310 of that storage enclosure 306 to perform various RAID processes, such as, e.g., RAID parity calculations, RAID array recovery operations, or other similar RAID processes.

Compute enclosures 308 may, for example, comprise storage controllers such as, e.g., storage controller 108 or storage controller 208 and may perform the functionality described herein in association with storage controllers of the storage systems 105, 205 and 305.

In some embodiments, storage enclosure 306 may also comprise a baseboard management controller (BMC) 320. BMC 320 is configured to monitor the physical state of the components of the storage enclosure 306, including, for example, processing devices 312 and to provide the state to an administrator for the storage system 305.

In some embodiments, communication between the processing devices 312 of each storage enclosure 306 and between storage enclosures 306 and compute enclosures 308 may be performed via a network fabric 309, e.g., an NVMeOF network fabric. In some embodiments, network fabric 309 may be part of network 104 of FIG. 1 or network 204 of FIG. 2. In some embodiments, network fabric 309 may be specific to storage system 305 and separate from network 104 where, for example, network fabric 309 provides communication channels between the various components of storage system 305.

While the following description may reference one of storage systems 105, 205 and 305, the functionality described below may also or alternatively be implemented in any of the other storage systems 105, 205 and 305.

In illustrative embodiments, RAID processing for a write flow may be offloaded from the storage controller 108 to the processing devices 112 of the storage enclosures 106 using write flow offload logic 114. By offloading the RAID processing to the processing devices 112, such as, e.g., calculating RAID parities, the processing resources of the storage controller 108 are freed up for use in processing additional input-output operations or other processing required by storage system 105. The increased availability of the processing resources of the storage controller 108 results in reduced system latency and increased system throughput as the storage controller 108 no longer needs to calculate RAID parities or perform other similar RAID processing.

In addition, because the RAID processing and calculation of RAID parities are performed by the processing devices 112 of the storage enclosure 106 where that data will be stored, bandwidth usage between the storage controller 108 and the RAID array 110 of the storage enclosure 106 is also reduced since the RAID parities or other similar data associated with the RAID processing does not need to be transferred between the storage controller 108 and the RAID array 110, thereby allowing the bandwidth to be utilized by the storage controller 108 for other data transfers, e.g., transferring more data pages, metadata, or other information data. For example, a RAID 6+2 scheme may typically require significant bandwidth for transferring RAID parities between the storage controller 108 and the storage enclosure 106, e.g., up to 25% or more of the bandwidth usage. In addition, if in-place upgrade RAID techniques are used instead of log-structured RAID techniques, the storage controller 108 is required to retrieve the entire RAID stripe from the disk array 110 for calculating the corresponding RAID parity before then sending the entire RAID stripe and calculated RAID parity back to the RAID array 110 for storage. Such a transfer of the RAID stripe and the RAID parities incurs significant bandwidth usage that may be better used for other input-output operations, for example, as described above. In addition, such reading and transfer of the RAID stripe may also result in substantial read amplification on the RAID array 110.

In some embodiments, the offloaded RAID processing for the write flow may be performed by software executing on the processing devices 112 of the storage enclosure 106. In some embodiments, the processing devices 112 may also or alternatively designate a hardware assisted offload engine included in the enclosure 106 for performing the RAID processing for the write flow. For example, a slot of the storage enclosure 106 may comprise a hardware offload engine that is configured to perform some or all of the RAID processing offloaded from the storage controller 108 to the processing devices 112 of that enclosure 106 or other enclosures 106.

Illustrative embodiments of the techniques and functionality of write flow offload logic 114 will now be described in more detail with reference to FIG. 4. The process of FIG. 4 is described with reference also to FIGS. 1-3.

Figure 4:
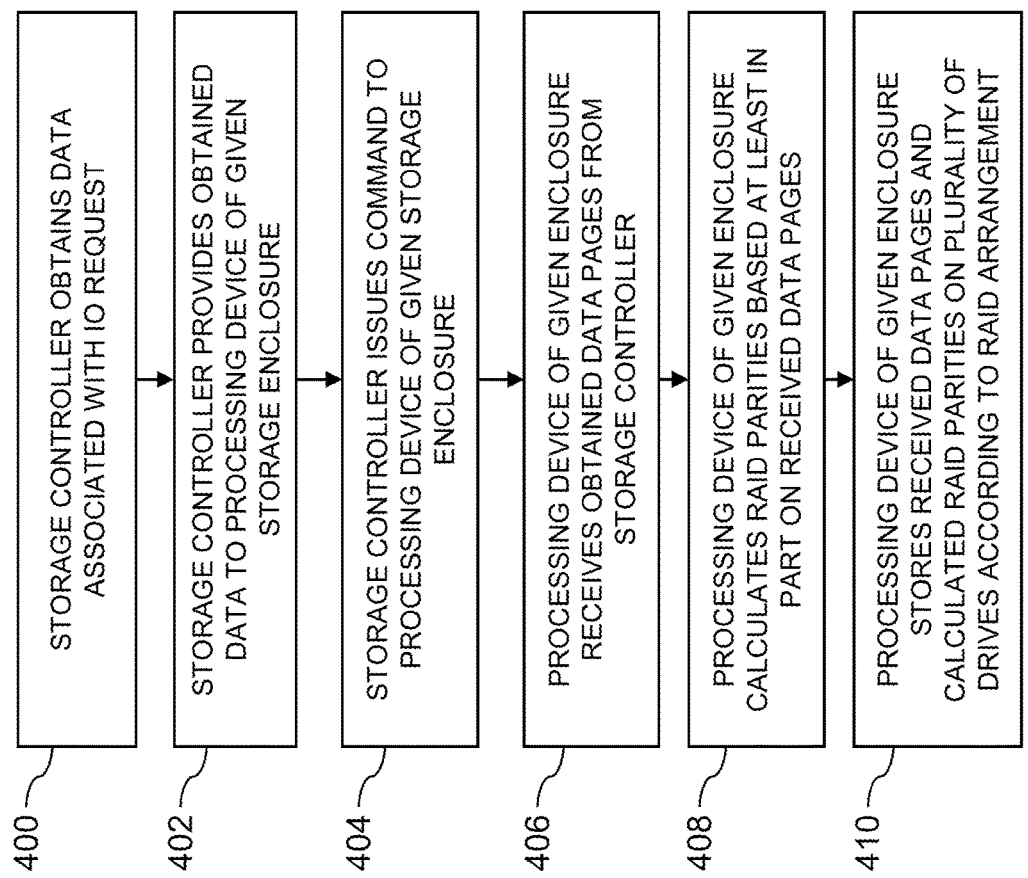
FIG. 4 is a flow diagram illustrating part of a methodology for write flow offloading in an illustrative embodiment.

The process as shown in FIG. 4 includes steps 400 through 410, and is suitable for use in the system 100 but is more generally applicable to other types of systems comprising multiple host devices and a shared storage system. The shared storage system in this embodiment is assumed to comprise at least one storage array having a plurality of storage devices. The storage devices can include logical storage devices, such as LUNs or other logical storage volumes.

At 400, storage controller 108 obtains data pages associated with an IO request, for example, from a host device 102. For example, the data pages may be obtained by the storage controller 108 under the NVMe protocol as a write command issued by the host device 102.

At 402, storage controller 108 provides the obtained data pages to the processing device 112 of a given storage enclosure 106 on which the data pages will be stored, e.g., via the network fabric 309 or another communication channel.

At 404, storage controller 108 issues a command to the processing device 112 of the given storage enclosure 106. For example, storage controller 108 may issue a command instructing the processing device 112 to perform one or more RAID operations such as, e.g., calculating RAID parity for a stripe on which the obtained data pages will be stored. In some embodiments, the command includes an indication or identification of a target stripe of RAID array 110 on which the obtained data pages will be stored.

For example, where a storage controller 108 will normally perform the RAID processing such as calculating RAID parity for data pages to be stored in a stripe itself, in the illustrative embodiments this processing is offloaded to the processing device 112 of the storage enclosure 106 itself, thereby preserving processing resources of the storage controller 108 for other uses.

At 406, the processing device 112 of the given storage enclosure 106 receives the obtained data pages from the storage controller 108, e.g., via the network fabric 309 or another communication channel.

At 408, responsive to receiving the command, the processing device 112 of the given storage enclosure 106 calculates the RAID parities based at least in part on the received data pages.

At 410, the processing device 112 stores the received data pages and the calculated RAID parities on the RAID array 110 according to the arrangement of the RAID array 110, e.g., in the target stripe indicated by the storage controller 108.

Once the storage controller 108 receives an indication that the data pages and parities have been written to the RAID array 110, the storage controller 108 hardens the new stripe layout and frees the associated journaling resources for those data pages in the storage system 105.

As described in the process of FIG. 4, once the storage controller sends the data pages and the command to the processing device 112, no further action to process the data pages is required on the part of the storage controller 108. Instead, the processing device 112 of the storage enclosure 106 performs the required RAID processing to calculate the RAID parities and store the data pages and RAID parities together on the RAID array 110.

The use of write flow offload logic 114 provides substantial benefits over utilizing the storage controller 108 to perform the RAID related processing during writes. For example, in the case of a 6+2 RAID scheme, up to 25% or more of the bandwidth on the data path between the storage controller 108 and the RAID array 110 may be saved by offloading the RAID calculations to the storage enclosure 106 since the RAID parities, and even the whole RAID stripe including the data pages (in the case of an in-place upgrade RAID scheme) do not need to be transferred between the storage controller 108 and the storage enclosure 106 which allows more resources to be available for use by storage controller 108 in servicing other IO requests.

In some embodiments, the data pages received by the processing device 112 from the storage controller 108 are initially stored in the designated stripe of the RAID array 110 and are loaded into memory of the processing device 112, e.g., memory 316, from that stripe for calculation of the RAID parities. Once the RAID parities are calculated, the RAID parities are then stored along with the already stored data pages according to the RAID arrangement of the RAID array 110.

In some embodiments, instead of initially storing the data pages in the designated stripe of RAID array 110, the data pages may instead be loaded directly into the memory of the processing device 112, e.g., memory 316. The processing device 112 may then calculate the RAID parities and store both the data pages and the RAID parities to the RAID array 110 in the designated stripe or a new stripe together, e.g., at the same time or in close approximation to the same time. By initially loading the data pages directly into the memory of the processing device 112 and not first storing them in the designated stripe of the RAID array 110, read amplification of the RAID array 110 may be avoided and an additional read of the data pages from the RAID array 110 to the memory of the processing device 112 just for parity calculations may also be avoided.

While the data pages are temporarily stored in the volatile memory of the processing device 112, and may be lost in the event of a system reboot, drive failure, or other issue, the data pages are still preserved by the journaling mechanism of the cache 109 since the layout of the stripe in the RAID array 110 is not hardened until the command is completed and the associated journal resources are released.

In illustrative embodiments, the processing for compression of data pages may be offloaded from the storage controller 108 to the processing devices 112 of the storage enclosures 106 using compression offload logic 116. By offloading the compression of the data pages to the processing devices 112, the processing resources of the storage controller 108 are freed up for use in processing additional IO operations or other processing required by storage system 105. The increased availability of the processing resources of the storage controller 108 results in reduced system latency and increased system throughput as the storage controller 108 no longer needs to perform the compression of the data pages prior to storing the data pages in the RAID array 110.

In some embodiments, the offloaded compression processing may be performed by software executing on the processing devices 112 of the storage enclosure 106. In some embodiments, the processing devices 112 may also or alternatively designate a hardware assisted offload engine included in the enclosure 106 for performing the compression processing. For example, a slot of the enclosure 106 may comprise a hardware offload engine that is configured to perform some or all of the compression processing offloaded from the storage controller 108 to the processing devices 112 of that enclosure 106 or other enclosures 106.

Illustrative embodiments of the techniques and functionality of compression offload logic 116 will now be described in more detail with reference to FIG. 5. The process of FIG. 5 is described with reference also to FIGS. 1-3.

Figure 5:
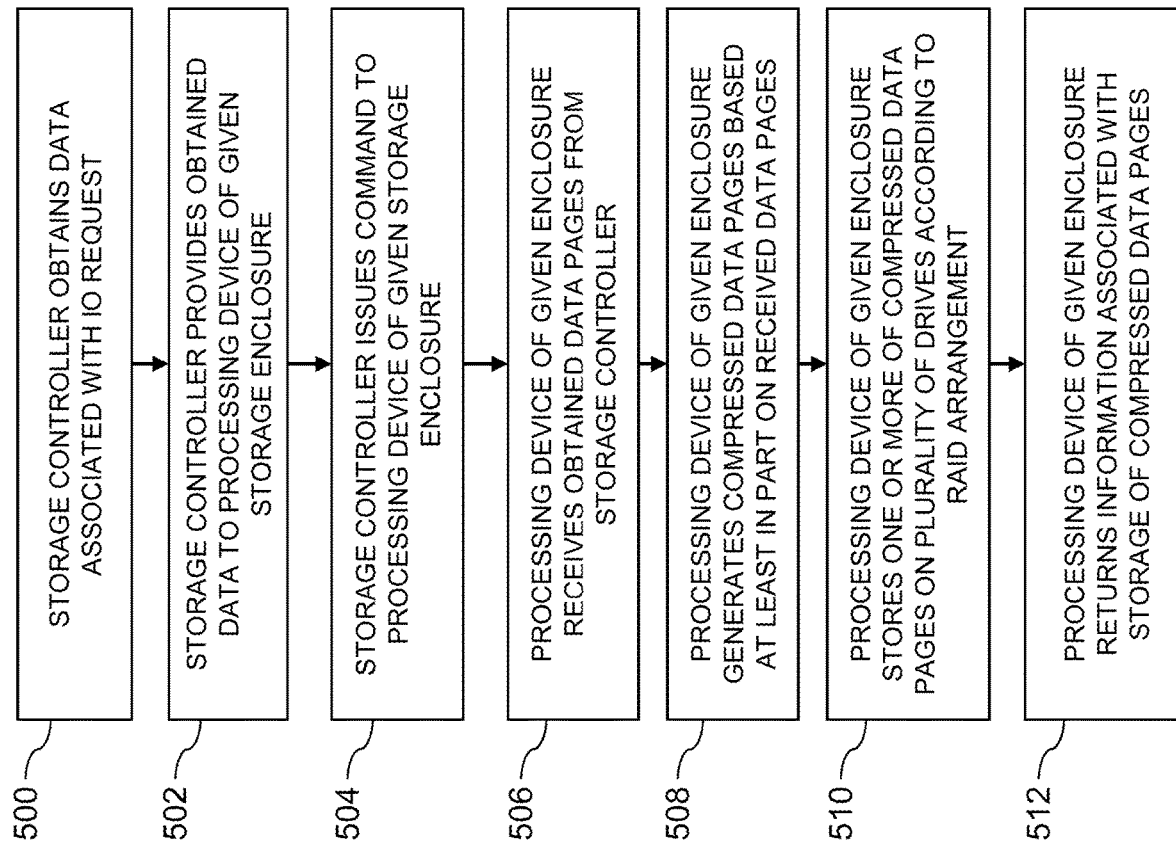
FIG. 5 is a flow diagram illustrating part of a methodology for compression offloading in an illustrative embodiment.

The process as shown in FIG. 5 includes steps 500 through 512, and is suitable for use in the system 100 but is more generally applicable to other types of systems comprising multiple host devices and a shared storage system. The shared storage system in this embodiment is assumed to comprise at least one storage array having a plurality of storage devices. The storage devices can include logical storage devices, such as LUNs or other logical storage volumes.

At 500, storage controller 108 obtains data pages associated with an IO request, for example, from a host device 102. For example, the data pages may be obtained by the storage controller 108 under the NVMe protocol as a write command issued by the host device 102.

At 502, storage controller 108 provides the obtained data pages to the processing device 112 of a given storage enclosure 106 on which the data pages will be stored, e.g., via the network fabric 309 or another communication channel.

At 504, storage controller 108 issues a command to the processing device 112 of the given storage enclosure 106. For example, storage controller 108 may issue a command instructing the processing device 112 to perform compression on the obtained data pages. In some embodiments, the command may also instruct the processing device 112 to perform one or more RAID operations such as, e.g., calculating RAID parity for a stripe on which compressed data pages will be stored. In some embodiments, the command includes an indication or identification of a target stripe of RAID array 110 on which the compressed data pages will be stored.

For example, where a storage controller 108 will normally perform the compression of data pages to be stored in a stripe by itself, in the illustrative embodiments this processing is offloaded to the processing device 112 of the storage enclosure 106, thereby preserving processing resources of the storage controller 108 for other uses.

At 506, the processing device 112 of the given storage enclosure 106 receives the obtained data pages from the storage controller 108, e.g., via the network fabric 309 or another communication channel.

At 508, responsive to receiving the command, the processing device 112 of the given storage enclosure 106 generates compressed data pages based at least in part on the received data pages. In some embodiments, the processing device 112 may also calculate RAID parities based at least in part on one or more of the compressed data pages.

At 510, the processing device 112 stores one or more of the compressed data pages and the calculated RAID parities on the RAID array 110 according to the arrangement of the RAID array 110, e.g., in the target stripe indicated by the storage controller 108.

At 512, the processing device 112 returns information, e.g., tokens, associated with the storage of the one or more compressed data pages to the storage controller 108. For example, the information may comprise tokens that indicate a location of the one or more compressed data pages on a stripe of the RAID array 110, an offset into the stripe, a compression ratio that was used in the compression, the compression algorithm, or other similar information.

In some embodiments, not all of the compressed data pages will fit on the target stripe. In such a circumstance, the information may also comprise a token or other indication of what data pages were not stored in the stripe. For example, the token may indicate a size of the compressed data pages that were not stored in the stripe.

In some embodiments, for example, where some or all of the data pages are not compressible, e.g., data pages comprising encrypted data or other similar uncompressible data, the information may also comprise a token or other indication of the data pages that were not compressible.

Once the storage controller 108 receives an indication that the one or more compressed data pages and associated parities have been written to the RAID array 110, the storage controller 108 hardens the new stripe layout and frees the associated journaling resources for those data pages in the storage system 105.

As described in the process of FIG. 5, once the storage controller sends the data pages and the command to the processing device 112, no further action to process the data pages is required on the part of the storage controller 108. Instead, the processing device 112 of the storage enclosure 106 performs the required compression of the data pages and calculation of the associated RAID parities and stores the compressed data pages and RAID parities together on the RAID array 110.

Because the storage controller 108 does not know what compression will be used on the data pages and the size of the data pages that is required to fill the RAID stripe, the storage controller 108 may, in illustrative embodiments, estimate the data pages that will be required to fill a RAID stripe on the RAID array 110. For example, in some embodiments, the storage controller 108 may send a set of data pages having a size that corresponds to an average or maximum compression ratio sufficient to fill a stripe to the processing device 112.

In an example scenario, where the size of the data pages sent by storage controller 108 to the processing device 112 is greater than the size of the target stripe after compression has been performed, processing device 112 may indicate to the storage controller 108 which extra compressed data pages, their size, or other similar information, were not stored on the stripe. The storage controller 108 may use this information when estimating the size of the next set of data pages to send to the processing device 112, for example, by reducing the size of the next set of data pages relative to the average or maximum compression ratio based at least in part on the presences of the extra compressed data pages that still need to be added to a stripe. The next set of data pages is then compressed by processing device 112 and some or all of those compressed data pages are stored in a stripe of the RAID array 110 along with the extra compressed data pages.

The processing device 112 may then once again indicate to the storage controller 108 which, if any, of the newly compressed data pages do not fit on the new stripe.

The use of compression offload logic 116 provides substantial benefits over utilizing the storage controller 108 to perform the compression during writes. For example, by offloading the compression to the processing device 112, more resources are available for use by storage controller 108 in servicing other IO requests.

In some embodiments, when an IO request to read a particular data page that is stored in compressed form on RAID array 110 is received by the storage controller 108, e.g., from a host device 102, the storage controller 108 may issue a command to the processing device 112 of a given storage enclosure 106 to retrieve the particular data page. In response to receiving the command, the processing device 112 may retrieve the corresponding compressed data page, decompress the data page, and provide the decompressed data page to the storage controller 108.

In some embodiments, processing device 112 may alternatively provide the compressed data page to the storage controller 108, i.e., without decompressing the data page, and the storage controller 108 may decompress the data page. This embodiment may reduce the required bandwidth to provide the data page from the storage enclosure 106 to the storage controller 108 since the data page is still compressed. The usage of processing resources is relatively minor as the decompression operations are not CPU intensive.

In some embodiments, for example, where a disk failure or other failure has occurred, the rebuilding of the RAID array 110 may also be offloaded to the processing device 112 of the storage enclosure 106 from the storage controller 108. For example, the processing device 112 may perform the RAID processes required to rebuild the disk, e.g., by reading the data pages and parities from the disks and calculating the needed data pages based at least in part on the parities. The rebuilt data pages may then be provided to the storage controller 108 by the processing device 112, in either compressed or uncompressed form, as described above.

While described as separate embodiments above, in some embodiments, the functionality implemented by the write flow offload logic 114 and compression offload logic 116 may be utilized together.

It is to be understood that for any methodologies described herein, e.g., write flow and compression offloading, the ordering of the process steps may be varied in other embodiments, or certain steps may be performed at least in part concurrently with one another rather than serially. Also, one or more of the process steps may be repeated periodically, or multiple instances of the process can be performed in parallel with one another in order to implement a plurality of different processes for different storage systems or for different RAID arrays or other data striping schemes on a particular storage system or systems.

Functionality such as that described herein can be implemented at least in part in the form of one or more software programs stored in memory and executed by a processor of a processing device such as a computer or server. As will be described below, a memory or other storage device having executable program code of one or more software programs embodied therein is an example of what is more generally referred to herein as a "processor-readable storage medium."

For example, a host device such as host device 102 or a storage controller such as storage controller 208 that is configured to control performance of one or more steps described herein can be implemented as part of what is more generally referred to herein as a processing platform comprising one or more processing devices each comprising a processor coupled to a memory. Such processing devices are to be distinguished from processing devices referred to herein with respect to the processing capabilities of the SSDs. In the case of a host device or storage controller, a given such processing device may correspond to one or more virtual machines or other types of virtualization infrastructure such as Docker containers or Linux containers (LXCs). The host device 102 of system 100 or the storage controller 208 of system 200, as well as other system components, may be implemented at least in part using processing devices of such processing platforms. For example, in a distributed implementation of the storage controller 208, respective distributed modules of such a storage controller can be implemented in respective containers running on respective ones of the processing devices of a processing platform.

In some embodiments, the storage system comprises an XtremIO™ storage array or other type of content addressable storage system suitably modified to incorporate functionality for write flow and compression offloading as disclosed herein.

An illustrative embodiment of such a content addressable storage system will now be described with reference to FIG. 6. In this embodiment, a content addressable storage system 605 comprises a plurality of storage devices 606, an associated storage controller 608, and an associated cache 609. The content addressable storage system 605 may be viewed as a particular implementation of the storage system 205, and accordingly is assumed to be coupled to host devices 202 of computer system 201 via network 204 within information processing system 200.

The storage controller 608 in the present embodiment is configured to implement functionality for write flow and compression offloading of the type previously described in conjunction with FIGS. 1 through 5.

The storage controller 608 includes write flow offload logic 614, which is configured to operate in a manner similar to that described above for respective corresponding write flow offload logic 114 and 214, and includes compression offload logic 616, which is configured to operate in a manner similar to that described above for respective corresponding compression offload logic 116 and 216.

The cache 609 is configured to operate in a manner similar to that described above for respective cache 109 and 209.

Figure 6:
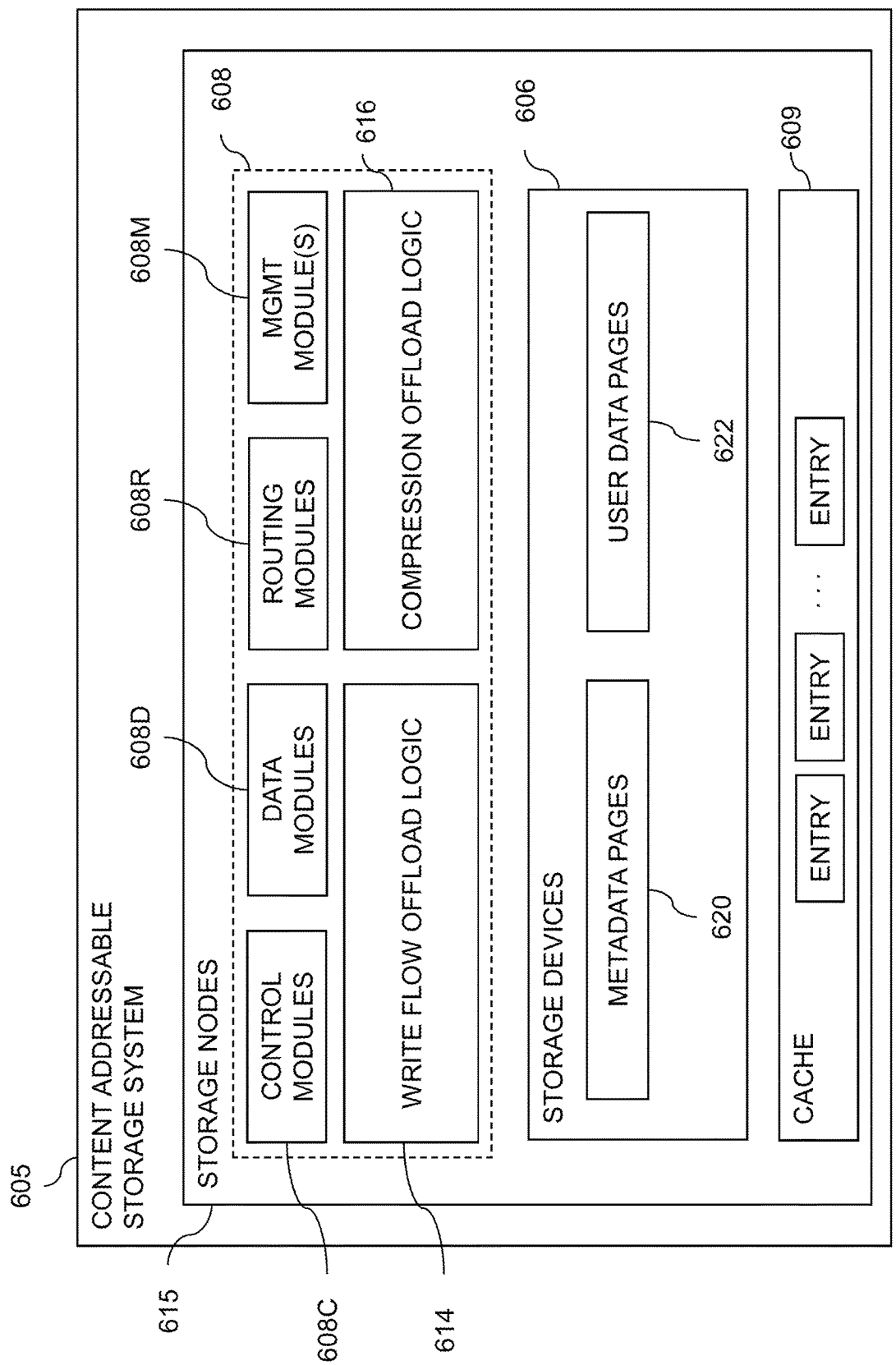
FIG. 6 shows a content addressable storage system having a distributed storage controller configured with functionality for performing write flow offloading and compression offloading in an illustrative embodiment.

The content addressable storage system 605 in the FIG. 6 embodiment is implemented as at least a portion of a clustered storage system and includes a plurality of storage nodes 615 each comprising a corresponding subset of the storage devices 606. Other clustered storage system arrangements comprising multiple storage nodes can be used in other embodiments. A given clustered storage system may include not only storage nodes 615 but also additional storage nodes coupled via a storage network. Alternatively, such additional storage nodes may be part of another clustered storage system of the system 200. Each of the storage nodes 615 of the storage system 605 is assumed to be implemented using at least one processing device comprising a processor coupled to a memory.

The storage controller 608 of the content addressable storage system 605 is implemented in a distributed manner so as to comprise a plurality of distributed storage controller components implemented on respective ones of the storage nodes 615. The storage controller 608 is therefore an example of what is more generally referred to herein as a "distributed storage controller." In subsequent description herein, the storage controller 608 may be more particularly referred to as a distributed storage controller.

Each of the storage nodes 615 in this embodiment further comprises a set of processing modules configured to communicate over one or more networks with corresponding sets of processing modules on other ones of the storage nodes 615. The sets of processing modules of the storage nodes 615 collectively comprise at least a portion of the distributed storage controller 608 of the content addressable storage system 605.

The modules of the distributed storage controller 608 in the present embodiment more particularly comprise different sets of processing modules implemented on each of the storage nodes 615. The set of processing modules of each of the storage nodes 615 comprises at least a control module 608C, a data module 608D and a routing module 608R. The distributed storage controller 608 further comprises one or more management ("MGMT") modules 608M. For example, only a single one of the storage nodes 615 may include a management module 608M. It is also possible that management modules 608M may be implemented on each of at least a subset of the storage nodes 615.

Each of the storage nodes 615 of the storage system 605 therefore comprises a set of processing modules configured to communicate over one or more networks with corresponding sets of processing modules on other ones of the storage nodes. A given such set of processing modules implemented on a particular storage node illustratively includes at least one control module 608C, at least one data module 608D and at least one routing module 608R, and possibly a management module 608M. These sets of processing modules of the storage nodes collectively comprise at least a portion of the distributed storage controller 608.

Communication links may be established between the various processing modules of the distributed storage controller 608 using well-known communication protocols such as IP, Transmission Control Protocol (TCP), and remote direct memory access (RDMA). For example, respective sets of IP links used in data transfer and corresponding messaging could be associated with respective different ones of the routing modules 608R.

Although shown as a separate logic of the distributed storage controller 608, the write flow offload logic 614 and compression offload logic 616 in the present embodiment are assumed to be distributed at least in part over at least a subset of the other modules 608C, 608D, 608R and 608M of the storage controller 608. Accordingly, at least portions of the functionality of write flow offload logic 614 and compression offload logic 616 may be implemented in one or more of the other modules of the storage controller 608. In other embodiments, the write flow offload logic 614 and compression offload logic 616 may be implemented as a stand-alone module of the storage controller 608.

The storage devices 606 are configured to store metadata pages 620 and user data pages 622 and may also store additional information not explicitly shown such as checkpoints and write journals. The metadata pages 620 and the user data pages 622 are illustratively stored in respective designated metadata and user data areas of the storage devices 606. Accordingly, metadata pages 620 and user data pages 622 may be viewed as corresponding to respective designated metadata and user data areas of the storage devices 606.

A given "page" as the term is broadly used herein should not be viewed as being limited to any particular range of fixed sizes. In some embodiments, a page size of 8 KB is used, but this is by way of example only and can be varied in other embodiments. For example, page sizes of 4 KB, 16 KB or other values can be used. Accordingly, illustrative embodiments can utilize any of a wide variety of alternative paging arrangements for organizing the metadata pages 620 and the user data pages 622.

The user data pages 622 are part of a plurality of logical units (LUNs) configured to store files, blocks, objects or other arrangements of data, each also generally referred to herein as a "data item," on behalf of users associated with host devices 202. Each such LUN may comprise particular ones of the above-noted pages of the user data area. The user data stored in the user data pages 622 can include any type of user data that may be utilized in the system 200. The term "user data" herein is therefore also intended to be broadly construed.

The content addressable storage system 605 in the embodiment of FIG. 6 is configured to generate hash metadata providing a mapping between content-based digests of respective ones of the user data pages 622 and corresponding physical locations of those pages in the user data area. Content-based digests generated using hash functions are also referred to herein as "hash digests." The hash metadata generated by the content addressable storage system 605 is illustratively stored as metadata pages 620 in the metadata area. The generation and storage of the hash metadata is assumed to be performed under the control of the storage controller 608.

Each of the metadata pages 620 characterizes a plurality of the user data pages 622. For example, a given set of user data pages representing a portion of the user data pages 622 illustratively comprises a plurality of user data pages denoted User Data Page 1, User Data Page 2, . . . User Data Page n. It should be noted that usage of the variable n in this user data page context is unrelated to its usage elsewhere herein.

Each of the user data pages 622 in this example is characterized by a LUN identifier, an offset and a content-based signature. The content-based signature is generated as a hash function of content of the corresponding user data page. Illustrative hash functions that may be used to generate the content-based signature include the above-noted SHA1 hash function, or other secure hashing algorithms known to those skilled in the art. The content-based signature is utilized to determine the location of the corresponding user data page within the user data area of the storage devices 606.

Each of the metadata pages 620 in the present embodiment is assumed to have a signature that is not content-based. For example, the metadata page signatures may be generated using hash functions or other signature generation algorithms that do not utilize content of the metadata pages as input to the signature generation algorithm. Also, each of the metadata pages is assumed to characterize a different set of the user data pages.

A given set of metadata pages representing a portion of the metadata pages 620 in an illustrative embodiment comprises metadata pages denoted Metadata Page 1, Metadata Page 2, . . . Metadata Page m, having respective signatures denoted Signature 1, Signature 2, . . . Signature m. Each such metadata page characterizes a different set of n user data pages. For example, the characterizing information in each metadata page can include the LUN identifiers, offsets and content-based signatures for each of the n user data pages that are characterized by that metadata page. It is to be appreciated, however, that the user data and metadata page configurations described above are examples only, and numerous alternative user data and metadata page configurations can be used in other embodiments.

Ownership of a user data logical address space within the content addressable storage system 605 is illustratively distributed among the control modules 608C.

The functionality provided by write flow offload logic 614 and compression offload logic 616 in this embodiment is assumed to be distributed across multiple distributed processing modules, including at least a subset of the processing modules 608C, 608D, 608R and 608M of the distributed storage controller 608.

For example, the management module 608M of the storage controller 608 may include logic that engages corresponding logic instances in all of the control modules 608C and routing modules 608R in order to implement processes for write flow offloading and compression offloading.

In some embodiments, the content addressable storage system 605 comprises an XtremIO™ storage array suitably modified to incorporate techniques for write flow offloading and compression offloading, as disclosed herein.

In arrangements of this type, the control modules 608C, data modules 608D and routing modules 608R of the distributed storage controller 608 illustratively comprise respective C-modules, D-modules and R-modules of the XtremIO™ storage array. The one or more management modules 608M of the distributed storage controller 608 in such arrangements illustratively comprise a system-wide management module ("SYM module") of the XtremIO™ storage array, although other types and arrangements of system-wide management modules can be used in other embodiments. Accordingly, functionality for write flow offloading and compression offloading in some embodiments is implemented under the control of at least one system-wide management module of the distributed storage controller 608, utilizing the C-modules, D-modules and R-modules of the XtremIO™ storage array.

In the above-described XtremIO™ storage array example, each user data page has a fixed size such as 8 KB and its content-based signature is a 20-byte signature generated using an SHA1 hash function. Also, each page has a LUN identifier and an offset, and so is characterized by <lun_id, offset, signature>.

The content-based signature in the present example comprises a content-based digest of the corresponding data page. Such a content-based digest is more particularly referred to as a "hash digest" of the corresponding data page, as the content-based signature is illustratively generated by applying a hash function such as SHA1 to the content of that data page. The full hash digest of a given data page is given by the above-noted 20-byte signature. The hash digest may be represented by a corresponding "hash handle," which in some cases may comprise a particular portion of the hash digest. The hash handle illustratively maps on a one-to-one basis to the corresponding full hash digest within a designated cluster boundary or other specified storage resource boundary of a given storage system. In arrangements of this type, the hash handle provides a lightweight mechanism for uniquely identifying the corresponding full hash digest and its associated data page within the specified storage resource boundary. The hash digest and hash handle are both considered examples of "content-based signatures" as that term is broadly used herein.

Examples of techniques for generating and processing hash handles for respective hash digests of respective data pages are disclosed in U.S. Pat. No. 9,208,162, entitled "Generating a Short Hash Handle," and U.S. Pat. No. 9,286,003, entitled "Method and Apparatus for Creating a Short Hash Handle Highly Correlated with a Globally-Unique Hash Signature," both of which are incorporated by reference herein.

As mentioned previously, storage controller components in an XtremIO™ storage array illustratively include C-module, D-module and R-module components. For example, separate instances of such components can be associated with each of a plurality of storage nodes in a clustered storage system implementation.

The distributed storage controller in this example is configured to group consecutive pages into page groups, to arrange the page groups into slices, and to assign the slices to different ones of the C-modules. For example, if there are 624 slices distributed evenly across the C-modules, and there are a total of 16 C-modules in a given implementation, each of the C-modules "owns" 1024/16=64 slices. In such arrangements, different ones of the slices are assigned to different ones of the control modules 608C such that control of the slices within the storage controller 608 of the storage system 605 is substantially evenly distributed over the control modules 608C of the storage controller 608.

The D-module allows a user to locate a given user data page based on its signature. Each metadata page also has a size of 8 KB and includes multiple instances of the <lun_id, offset, signature>for respective ones of a plurality of the user data pages. Such metadata pages are illustratively generated by the C-module but are accessed using the D-module based on a metadata page signature.

The metadata page signature in this embodiment is a 20-byte signature but is not based on the content of the metadata page. Instead, the metadata page signature is generated based on an 8-byte metadata page identifier that is a function of the LUN identifier and offset information of that metadata page.

If a user wants to read a user data page having a particular LUN identifier and offset, the corresponding metadata page identifier is first determined, then the metadata page signature is computed for the identified metadata page, and then the metadata page is read using the computed signature. In this embodiment, the metadata page signature is more particularly computed using a signature generation algorithm that generates the signature to include a hash of the 8-byte metadata page identifier, one or more ASCII codes for particular predetermined characters, as well as possible additional fields. The last bit of the metadata page signature may always be set to a particular logic value so as to distinguish it from the user data page signature in which the last bit may always be set to the opposite logic value.

The metadata page signature is used to retrieve the metadata page via the D-module. This metadata page will include the <lun_id, offset, signature>for the user data page if the user page exists. The signature of the user data page is then used to retrieve that user data page, also via the D-module.

Write requests processed in the content addressable storage system 605 each illustratively comprise one or more IO operations directing that at least one data item of the storage system 605 be written to in a particular manner. A given write request is illustratively received in the storage system 605 from a host device, illustratively one of the host devices 202. In some embodiments, a write request is received in the distributed storage controller 608 of the storage system 605 and directed from one processing module to another processing module of the distributed storage controller 608. For example, a received write request may be directed from a routing module 608R of the distributed storage controller 608 to a particular control module 608C of the distributed storage controller 608. Other arrangements for receiving and processing write requests from one or more host devices can be used.

The term "write request" as used herein is intended to be broadly construed, so as to encompass one or more IO operations directing that at least one data item of a storage system be written to in a particular manner. A given write request is illustratively received in a storage system from a host device.

In the XtremIO™ context, the C-modules, D-modules and R-modules of the storage nodes 615 communicate with one another over a high-speed internal network such as an InfiniBand network. The C-modules, D-modules and R-modules coordinate with one another to accomplish various IO processing tasks.

The write requests from the host devices identify particular data pages to be written in the storage system 605 by their corresponding logical addresses each comprising a LUN ID and an offset.

As noted above, a given one of the content-based signatures illustratively comprises a hash digest of the corresponding data page, with the hash digest being generated by applying a hash function to the content of that data page. The hash digest may be uniquely represented within a given storage resource boundary by a corresponding hash handle.

The storage system 605 utilizes a two-level mapping process to map logical block addresses to physical block addresses. The first level of mapping uses an address-to-hash ("A2H") table and the second level of mapping uses a hash metadata ("HMD") table, with the A2H and HMD tables corresponding to respective logical and physical layers of the content-based signature mapping within the storage system 605.

The first level of mapping using the A2H table associates logical addresses of respective data pages with respective content-based signatures of those data pages. This is also referred to logical layer mapping.

The second level of mapping using the HMD table associates respective ones of the content-based signatures with respective physical storage locations in one or more of the storage devices 606. This is also referred to as physical layer mapping.

For a given write request, both of the corresponding HMD and A2H tables are updated in conjunction with the processing of that write request.

The A2H and HMD tables described above are examples of what are more generally referred to herein as "mapping tables" of respective first and second distinct types. Other types and arrangements of mapping tables or other content-based signature mapping information may be used in other embodiments.

The logical block addresses or LBAs of a logical layer of the storage system 605 correspond to respective physical blocks of a physical layer of the storage system 605. The user data pages of the logical layer are organized by LBA and have reference via respective content-based signatures to particular physical blocks of the physical layer.

Each of the physical blocks has an associated reference count that is maintained within the storage system 605. The reference count for a given physical block indicates the number of logical blocks that point to that same physical block.

In releasing logical address space in the storage system, a dereferencing operation is generally executed for each of the LBAs being released. More particularly, the reference count of the corresponding physical block is decremented. A reference count of zero indicates that there are no longer any logical blocks that reference the corresponding physical block, and so that physical block can be released.

It should also be understood that the particular arrangement of storage controller processing modules 608C, 608D, 608R and 608M as shown in the FIG. 6 embodiment is presented by way of example only. Numerous alternative arrangements of processing modules of a distributed storage controller may be used to implement functionality for determining compression block size and selecting prime numbers and associated numbers of sub-stripes for efficient packing of compressed data in a clustered storage system in other embodiments.

Additional examples of content addressable storage functionality implemented in some embodiments by control modules 608C, data modules 608D, routing modules 608R and management module(s) 608M of distributed storage controller 608 can be found in U.S. Pat. No. 9,104,326, entitled "Scalable Block Data Storage Using Content Addressing," which is incorporated by reference herein. Alternative arrangements of these and other storage node processing modules of a distributed storage controller in a content addressable storage system can be used in other embodiments.

Illustrative embodiments of host devices or storage systems with functionality for write flow offloading and compression offloading can provide a number of significant advantages relative to conventional arrangements. For example, some embodiments provide techniques for write flow offloading and compression offloading that reduce the processing that is required to be performed by the storage controller and reduce the amount of bandwidth usage between the storage controller and the RAID array. These techniques allow the storage controller to free up processing resources and bandwidth for use in servicing additional IO requests or other system needs.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

Illustrative embodiments of processing platforms utilized to implement host devices and storage systems with functionality for write flow offloading and compression offloading will now be described in greater detail with reference to FIGS. 7 and 8. Although described in the context of system 100, these platforms may also be used to implement at least portions of other information processing systems in other embodiments.

Figure 7:
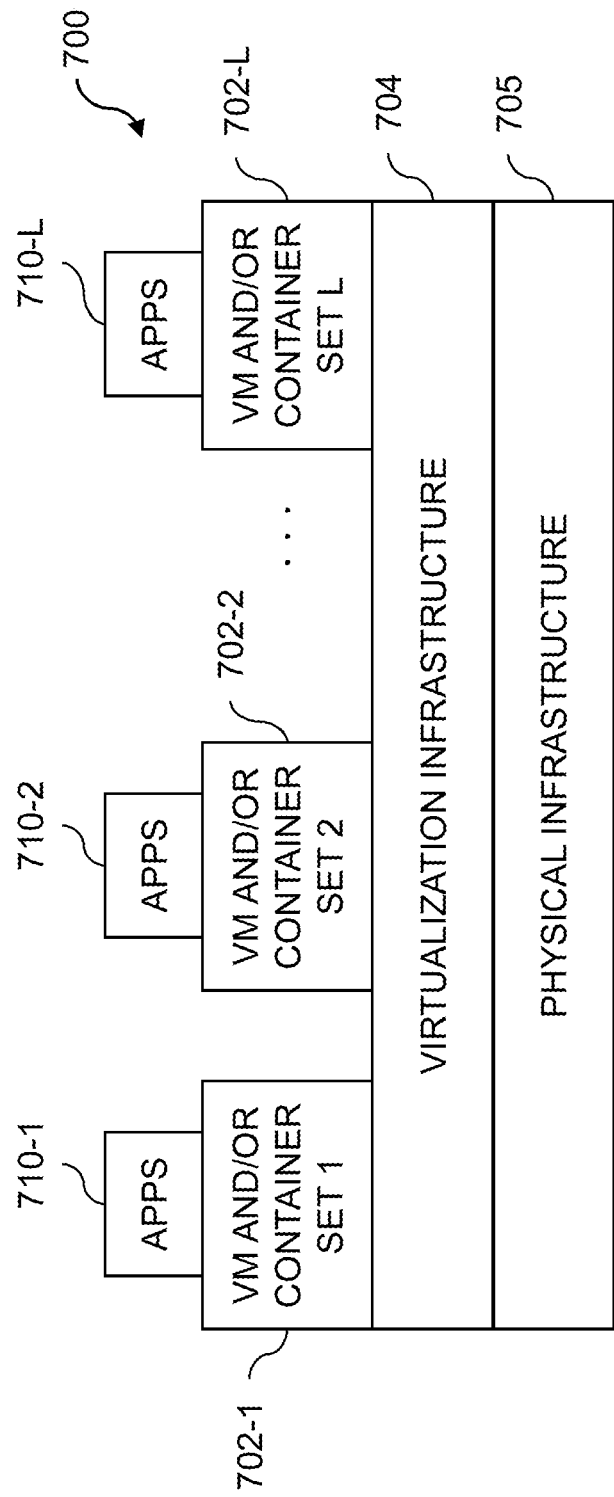

FIG. 7 shows an example processing platform comprising cloud infrastructure 700. The cloud infrastructure 700 comprises a combination of physical and virtual processing resources that may be utilized to implement at least a portion of the information processing system 100. The cloud infrastructure 700 comprises multiple virtual machines (VMs) and/or container sets 702-1, 702-2, . . . 702-L implemented using virtualization infrastructure 704. The virtualization infrastructure 704 runs on physical infrastructure 705, and illustratively comprises one or more hypervisors and/or operating system level virtualization infrastructure. The operating system level virtualization infrastructure illustratively comprises kernel control groups of a Linux operating system or other type of operating system.

The cloud infrastructure 700 further comprises sets of applications 710-1, 710-2, . . . 710-L running on respective ones of the VMs/container sets 702-1, 702-2, . . . 702-L under the control of the virtualization infrastructure 704. The VMs/container sets 702 may comprise respective VMs, respective sets of one or more containers, or respective sets of one or more containers running in VMs.

In some implementations of the FIG. 7 embodiment, the VMs/container sets 702 comprise respective VMs implemented using virtualization infrastructure 704 that comprises at least one hypervisor. Such implementations can provide functionality for write flow offloading and compression offloading of the type described above for one or more processes running on a given one of the VMs. For example, each of the VMs can implement such functionality for one or more processes running on that particular VM.

An example of a hypervisor platform that may be used to implement a hypervisor within the virtualization infrastructure 704 is the VMware® vSphere® which may have an associated virtual infrastructure management system such as the VMware® vCenter™. The underlying physical machines may comprise one or more distributed processing platforms that include one or more storage systems.

In other implementations of the FIG. 7 embodiment, the VMs/container sets 702 comprise respective containers implemented using virtualization infrastructure 704 that provides operating system level virtualization functionality, such as support for Docker containers running on bare metal hosts, or Docker containers running on VMs. The containers are illustratively implemented using respective kernel control groups of the operating system. Such implementations can provide functionality for write flow offloading and compression offloading of the type described above for one or more processes running on different ones of the containers. For example, a container host device supporting multiple containers of one or more container sets can implement one or more instances of such functionality or logic.

As is apparent from the above, one or more of the processing modules or other components of system 100 may each run on a computer, server, storage device or other processing platform element. A given such element may be viewed as an example of what is more generally referred to herein as a "processing device." The cloud infrastructure 700 shown in FIG. 7 may represent at least a portion of one processing platform. Another example of such a processing platform is processing platform 800 shown in FIG. 8.

The processing platform 800 in this embodiment comprises a portion of system 100 or 200 and includes a plurality of processing devices, denoted 802-1, 802-2, 802-3, . . . 802-K, which communicate with one another over a network 804.

The network 804 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

The processing device 802-1 in the processing platform 800 comprises a processor 810 coupled to a memory 812.

The processor 810 may comprise a microprocessor, a microcontroller, an application-specific integrated circuit (ASIC), a field-programmable gate array (FPGA) or other type of processing circuitry, as well as portions or combinations of such circuitry elements.

The memory 812 may comprise random access memory (RAM), read-only memory (ROM), flash memory or other types of memory, in any combination. The memory 812 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM, flash memory or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 802-1 is network interface circuitry 814, which is used to interface the processing device with the network 804 and other system components and may comprise conventional transceivers.

The other processing devices 802 of the processing platform 800 are assumed to be configured in a manner similar to that shown for processing device 802-1 in the figure.

Again, the particular processing platform 800 shown in the figure is presented by way of example only, and system 100 or 200 may include additional or alternative processing platforms, as well as numerous distinct processing platforms in any combination, with each such platform comprising one or more computers, servers, storage devices or other processing devices.

For example, other processing platforms used to implement illustrative embodiments can comprise converged infrastructure such as VxRail™, VxRack™, VxRack™ FLEX, VxBlock™ or Vblock® converged infrastructure from VCE, the Virtual Computing Environment Company, now the Converged Platform and Solutions Division of Dell EMC.

It should therefore be understood that in other embodiments different arrangements of additional or alternative elements may be used. At least a subset of these elements may be collectively implemented on a common processing platform, or each such element may be implemented on a separate processing platform.

As indicated previously, components of an information processing system as disclosed herein can be implemented at least in part in the form of one or more software programs stored in memory and executed by a processor of a processing device. For example, at least portions of the functionality for determining compression block size and selecting prime numbers and associated numbers of sub-stripes for efficient packing of compressed data as disclosed herein are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, host devices, storage systems, storage nodes, storage devices, storage controllers, RAID arrays or other data striping, etc. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An apparatus comprising:
a storage system comprising a plurality of enclosures and a storage controller, each enclosure comprising at least one processing device coupled to memory and a redundant array of independent disks (RAID) arrangement comprising a plurality of drives, the at least one processing device being separate from the RAID arrangement;
the storage controller configured:
to obtain data pages associated with at least one input-output request;
to provide the obtained data pages to the at least one processing device of a given enclosure of the plurality of enclosures; and
to issue a command to the at least one processing device of the given enclosure to perform at least one operation based at least in part on the obtained data pages;
the at least one processing device of the given enclosure configured:
to receive the obtained data pages from the storage controller;
responsive to receiving the command from the storage controller, to generate compressed data pages based at least in part on the received data pages;
to store one or more of the compressed data pages on a stripe of the plurality of drives according to the RAID arrangement;
to determine that at least one other compressed data page of the compressed data pages does not fit on the stripe of the plurality of drives and has not been stored on the plurality of drives; and
to return information associated with the storage of the one or more of the compressed data pages to the storage controller, the information comprising an indication that the at least one other compressed data page does not fit on the stripe of the plurality of drives and has not been stored on the plurality of drives and a size of the at least one other compressed data page, the storage controller being configured to utilize the information to access the one or more of the compressed data pages stored on the plurality of drives;
wherein the storage controller is further configured:
to obtain additional data pages associated with another input-output request;
to determine an estimated size of data pages that when compressed by the at least one processing device of the given enclosure would fill a stripe;
to reduce the estimated size based at least in part on the size of the at least one other compressed data page found in the information;
to select one or more data pages of the additional data pages based at least in part on the reduced estimated size; and
to provide the selected one or more data pages of the additional data pages to the at least one processing device of the given enclosure.

2. The apparatus of claim 1 wherein the information comprises an indication of a location of each of the one or more compressed data pages that was stored on the plurality of drives and a size of each of the one or more compressed data pages that was stored on the plurality of drives.

3. The apparatus of claim 1 wherein generating the compressed data pages based at least in part on the received data pages comprises at least one of:
causing a compression offload engine of the storage system to compress the received data pages; and
compressing the received data pages by the at least one processing device of the given enclosure.

4. The apparatus of claim 1 wherein responsive to receiving a read command from the storage controller that targets a compressed data page stored in the plurality of drives, the at least one processing device of the given enclosure is configured:
to retrieve the targeted compressed data page from the plurality of drives;
to decompress the targeted compressed data page to generate a decompressed data page; and
to provide the decompressed data page to the storage controller.

5. The apparatus of claim 1
wherein responsive to receiving a read command from the storage controller that targets a compressed data page stored in the plurality of drives, the at least one processing device of the given enclosure is configured:
to retrieve the targeted compressed data page from the plurality of drives; and
to provide the targeted compressed data page to the storage controller;
wherein responsive to receiving targeted compressed data page from the at least one processing device of the given enclosure, the storage controller is configured:
to receive the targeted compressed data page from the at least one processing device of the given enclosure; and
to decompress the targeted compressed data page.

6. The apparatus of claim 1
wherein responsive an indication of a disk failure, the at least one processing device of the given enclosure is configured:
to read RAID parities from the plurality of drives;
to regenerate the one or more compressed data pages based at least in part on the RAID parities;
to decompress the regenerated one or more compressed data pages; and
to provide the one or more decompressed data pages to the storage controller.

7. A method comprising:
obtaining, by a storage controller of a storage system, data pages associated with at least one input-output request, the storage system comprising a plurality of enclosures and the storage controller, each enclosure comprising at least one processing device coupled to memory and a redundant array of independent disks (RAID) arrangement comprising a plurality of drives, the at least one processing device being separate from the RAID arrangement;
providing, by the storage controller, the obtained data pages to the at least one processing device of a given enclosure of the plurality of enclosures;
issuing, by the storage controller, a command to the at least one processing device of the given enclosure to perform at least one operation based at least in part on the obtained data pages;
receiving, by the at least one processing device of the given enclosure, the obtained data pages from the storage controller;
responsive to receiving the command from the storage controller, generating, by the at least one processing device of the given enclosure, compressed data pages based at least in part on the received data pages;

storing, by the at least one processing device of the given enclosure, one or more of the compressed data pages on the plurality of drives according to the RAID arrangement;

determining, by the at least one processing device of the given enclosure, that at least one other compressed data page of the compressed data pages does not fit on the stripe of the plurality of drives and has not been stored on the plurality of drives;

returning, by the at least one processing device of the given enclosure, information associated with the storage of the one or more of the compressed data pages to the storage controller, the information comprising an indication that the at least one other compressed data page does not fit on the stripe of the plurality of drives and has not been stored on the plurality of drives and a size of the at least one other compressed data page, the storage controller being configured to utilize the information to access the one or more of the compressed data pages stored on the plurality of drives;

obtaining, by the storage controller, additional data pages associated with another input-output request;

determining, by the storage controller, an estimated size of data pages that when compressed by the at least one processing device of the given enclosure would fill a stripe;

reducing, by the storage controller, the estimated size based at least in part on the size of the at least one other compressed data page found in the information;

selecting, by the storage controller, one or more data pages of the additional data pages based at least in part on the reduced estimated size; and providing, by the storage controller, the selected one or more data pages of the additional data pages to the at least one processing device of the given enclosure.

8. The method of claim 7 wherein the information comprises an indication of a location of each of the one or more compressed data pages that was stored on the plurality of drives and a size of each of the one or more compressed data pages that was stored on the plurality of drives.

9. The method of claim 7 wherein generating the compressed data pages based at least in part on the received data pages comprises at least one of:
  causing a compression offload engine of the storage system to compress the received data pages; and
  compressing the received data pages by the at least one processing device of the given enclosure.

10. The method of claim 7 wherein the method further comprises:
  receiving, by the at least one processing device of the given enclosure, the selected one or more data pages of the additional data pages from the storage controller;
  generating, by the at least one processing device of the given enclosure, additional compressed data pages based at least in part on the selected one or more data pages; and
  storing, by the at least one processing device of the given enclosure, the at least one other compressed data page and one or more of the additional compressed data pages together in another stripe on the plurality of drives.

11. The method of claim 7 wherein responsive to receiving, by the at least one processing device of the given enclosure, a read command from the storage controller that targets a compressed data page stored in the plurality of drives, the method further comprises:
  retrieving, by the at least one processing device of the given enclosure, the targeted compressed data page from the plurality of drives;
  decompressing, by the at least one processing device of the given enclosure, the targeted compressed data page to generate a decompressed data page;
  providing, by the at least one processing device of the given enclosure, the decompressed data page to the storage controller.

12. The method of claim 7 wherein responsive to receiving, by the at least one processing device of the given enclosure, a read command from the storage controller that targets a compressed data page stored in the plurality of drives, the method further comprises:
  retrieving, by the at least one processing device of the given enclosure, the targeted compressed data page from the plurality of drives; and
  providing, by the at least one processing device of the given enclosure, the targeted compressed data page to the storage controller;
wherein the method further comprises:
  receiving, by the storage controller, the targeted compressed data page from the at least one processing device of the given enclosure; and
  decompressing, by the storage controller, the targeted compressed data page.

13. The method of claim 7 wherein responsive an indication of a disk failure, the method further comprises:
  reading, by the at least one processing device of the given enclosure, RAID parities from the plurality of drives;
  regenerating, by the at least one processing device of the given enclosure, the one or more compressed data pages based at least in part on the RAID parities;
  decompressing, by the at least one processing device of the given enclosure, the regenerated one or more compressed data pages; and
  providing, by the at least one processing device of the given enclosure, the one or more decompressed data pages to the storage controller.

14. A computer program product comprising a non-transitory processor-readable storage medium having stored therein program code of one or more software programs, the program code being executable by a storage system, the storage system comprising a plurality of enclosures and a storage controller, each enclosure comprising at least one processing device coupled to memory and a redundant array of independent disks (RAID) arrangement comprising a plurality of drives, the at least one processing device being separate from the RAID arrangement;

the program code, when executed by the storage controller of the storage system, causes the storage controller of the storage system:
  to obtain data pages associated with at least one input-output request; and
  to provide the obtained data pages to the at least one processing device of a given enclosure of the plurality of enclosures;
  to issue a command to the at least one processing device of the given enclosure to perform at least one operation based at least in part on the obtained data pages;

the program code, when executed by the at least one processing device of the given enclosure, causes the at least one processing device of the given enclosure:

to receive the obtained data pages from the storage controller;

responsive to receiving the command from the storage controller, to generate compressed data pages based at least in part on the received data pages;

to store one or more of the compressed data pages on a stripe of the plurality of drives according to the RAID arrangement;

to determine that at least one other compressed data page of the compressed data pages does not fit on the stripe of the plurality of drives and has not been stored on the plurality of drives; and to return information associated with the storage of the one or more of the compressed data pages to the storage controller, the information comprising an indication that the at least one other compressed data page does not fit on the stripe of the plurality of drives and has not been stored on the plurality of drives and a size of the at least one other compressed data page, the storage controller being configured to utilize the information to access the one or more of the compressed data pages stored on the plurality of drives;

wherein the program code, when executed by the storage controller of the storage system, further causes the storage controller of the storage system:

to obtain additional data pages associated with another input-output request;

to determine an estimated size of data pages that when compressed by the at least one processing device of the given enclosure would fill a stripe;

to reduce the estimated size based at least in part on the size of the at least one other compressed data page found in the information;

to select one or more data pages of the additional data pages based at least in part on the reduced estimated size; and to provide the selected one or more data pages of the additional data pages to the at least one processing device of the given enclosure.

15. The computer program product of claim 14 wherein the information comprises an indication of a location of each of the one or more compressed data pages that was stored on the plurality of drives and a size of each of the one or more compressed data pages that was stored on the plurality of drives.

16. The computer program product of claim 14 wherein generating the compressed data pages based at least in part on the received data pages comprises at least one of:

causing a compression offload engine of the storage system to compress the received data pages; and compressing the received data pages by the at least one processing device of the given enclosure.

17. The computer program product of claim 14 wherein the program code, when executed by the at least one processing device of the given enclosure, further causes the at least one processing device of the given enclosure:

to receive the selected one or more data pages of the additional data pages from the storage controller;

to generate additional compressed data pages based at least in part on the selected one or more data pages; and to store the at least one other compressed data page and one or more of the additional compressed data pages together in another stripe on the plurality of drives.

18. The computer program product of claim 14 wherein responsive to receiving a read command from the storage controller that targets a compressed data page stored in the plurality of drives, the program code, when executed by the at least one processing device of the given enclosure, further causes the at least one processing device of the given enclosure:

to retrieve the targeted compressed data page from the plurality of drives, and at least one of:

decompress the targeted compressed data page to generate a decompressed data page and provide the decompressed data page to the storage controller; and provide the targeted compressed data page to the storage controller.

19. The apparatus of claim 1 wherein the at least one processing device of the given enclosure is further configured:

to receive the selected one or more data pages of the additional data pages from the storage controller;

to generate additional compressed data pages based at least in part on the selected one or more data pages; and to store the at least one other compressed data page and one or more of the additional compressed data pages together in another stripe on the plurality of drives.

20. The apparatus of claim 1 wherein determining the estimated size of data pages that when compressed by the at least one processing device of the given enclosure would fill a stripe comprises determining the estimated size that corresponds to one of:

a size that would fill a stripe after compression has been performed using a first compression ratio that is an average of a set of available compression ratios; and a size that would fill a stripe after compression has been performed using a second compression ratio that is the highest compression ratio of the set of available compression ratios.

* * * * *